United States Patent [19]
Yuan et al.

[11] Patent Number: 5,610,085
[45] Date of Patent: Mar. 11, 1997

[54] METHOD OF MAKING A VERTICAL FET USING EPITAXIAL OVERGROWTH

[75] Inventors: Han-Tzong Yuan; Tae S. Kim; Donald L. Plumton, all of Dallas, Tex.

[73] Assignee: Texas Instruments Incorporated, Dallas, Tex.

[21] Appl. No.: 483,028

[22] Filed: Jun. 7, 1995

Related U.S. Application Data

[60] Division of Ser. No. 323,959, Oct. 17, 1994, abandoned, which is a continuation-in-part of Ser. No. 159,353, Nov. 29, 1993, Pat. No. 5,554,561.

[51] Int. Cl.$^6$ ............................................. H01L 21/265
[52] U.S. Cl. ............................ 437/29; 437/40; 437/41
[58] Field of Search ................................ 437/29, 40 DM, 437/41 DM

[56] References Cited

U.S. PATENT DOCUMENTS

| | | | |
|---|---|---|---|
| 4,616,400 | 10/1986 | Macksay et al. | 437/29 |
| 4,712,122 | 12/1987 | Nishizawa et al. | 357/22 |
| 4,729,964 | 3/1988 | Natsuaki et al. | 437/29 |
| 4,788,156 | 11/1988 | Stoneham et al. | 437/29 |
| 5,066,603 | 11/1991 | Bulat et al. | 437/29 |
| 5,231,037 | 7/1993 | Yuan et al. | 437/40 |
| 5,281,543 | 1/1994 | Fukuzawa et al. | 437/29 |
| 5,284,782 | 2/1994 | Jeong et al. | 437/29 |
| 5,364,816 | 11/1994 | Boos et al. | 437/29 |

OTHER PUBLICATIONS

Alferov et al., "Buried–gate gallium arsenide vertical field–effect transistor," Sov. Tech. Phys. Lett 12(2), Feb. 1986, pp. 77–78.

Ghandi, "VLSI Fabrication Principles", J. Wiley & Sons, 1983, pp. 12–14, 213–217.

Primary Examiner—Tom Thomas
Assistant Examiner—Lynne A. Gurley
Attorney, Agent, or Firm—Carlton H. Hoel; W. James Brady, III; Richard L. Donaldson

[57] ABSTRACT

A vertical field effect transistor (1700) and fabrication method with buried gates (1704) having spaced apart gate fingers and connecting structure and overgrown with source and channel epilayer followed by a doping connection of the gate fingers and connecting structure is disclosed. The vertical field effect transistor elements (1702, 1704, 1706, 1708, 1720, 1724) are made of III–V semiconductor compound grown on a germanium substrate (1726).

6 Claims, 15 Drawing Sheets

(PLAN VIEW)

(CROSS SECTION)

(CROSS SECTION)

*(PLAN VIEW)*

*(CROSS SECTION)*

*(CROSS SECTION)*

(PLAN VIEW)

METHOD OF MAKING A VERTICAL FET USING EPITAXIAL OVERGROWTH

CROSS-REFERENCE TO RELATED APPLICATIONS

This is a divisional of application Ser. No. 08/323,959, filed Oct. 17, 1994, now abandoned, which is a continuation-in-part of application Ser. No. 08/159,353, filed Nov. 29, 1993, now U.S. Pat. No. 5,554,561. The following applications contain subject matter related to the present application and are assigned to the assignee of the present application: application Ser. Nos. 07/876,252, filed Apr. 30, 1992; 08/036,584, filed Mar. 24, 1993; 08/056,682, filed Apr. 30, 1993; 08/055,421, filed Apr. 30, 1993; 08/056,681, filed Apr. 30, 1993; and 08/158,673, filed Nov. 29, 1993.

BACKGROUND OF THE INVENTION

The invention relates to electronic semiconductor devices and circuits, and, more particularly, to methods of fabrication with epitaxial overgrowth and devices so fabricated.

Various semiconductor processing flows include formation of epitaxial layers on substrates. Such epilayers may provide a change in doping level, a crystal superior to the substrate's, or even a change in material such as a gallium arsenide (GaAs) substrate with an aluminum gallium arsenide ($Al_xGa_{1-x}As$) epilayer for heterojunction devices. Epilayer growth by metalorganic chemical vapor deposition (MOCVD) on {100} oriented GaAs substrates produces smoother surfaces when the substrate orientation is tilted 2° in the {110} direction, and industry standard GaAs wafers have such an orientation tilt. This tilt provides a slightly terraced surface (terrace widths on the order of 10–20 nm) which apparently insures smooth epilayer growth.

Certain processing flows include epitaxial overgrowth of nonplanar structures. In particular, silicon bipolar transistor processes frequently have a buffed layer formed by epitaxial overgrowth of a doped region which has been depressed below the substrate surface by an oxidizing drive-in cycle. But more significantly, heterojunction bipolar transistors (HBTs) and self-aligned structure (SAS) lasers can be fabricated with epitaxial growth over steps in a GaAs layer. See Plumton et al, Planar AlGaAs/GaAs HBT Fabricated by MOCVD Overgrowth with a Grown Base, 37 IEEE Trans. Elec. Dev. 118 (1990)(growth of n-$Al_xGa_{1-x}As$ emitter over p-GaAs base mesa for an HBT) and Noda et al, Effects of GaAs/AlAs superlattic buffer layers on selective area regrowth for GaAs/AlGaAs self-aligned structure lasers, 47 Appl. Phys. Lett. 1205 (1985)(molecular beam epitaxy growth of p-$Al_xGa_{1-x}As$ over n-GaAs antiguiding mesa for a SAS laser). However, such epitaxial overgrowth on step structures has problems including finding growth conditions for enhancing device performance.

Solar cells made of GaAs provide radiation hardness and find use as power supplies for spacecraft and earth communication satellites. However, GaAs substrates have problems including a lack of strength, so growing GaAs on germanium (Ge) has been of interest for solar cells. For example, Iles et al, High-Efficiency (>20% AM0) GaAs Solar Cells Grown on Inactive-Ge Substrates, 11 IEEE Elec.Dev.Lett. 170 (1990), and Chen et al, GaAs/Ge Heterojunction Grown by Meatl-Organic Chemical Vapor Deposition and its Application to High Efficiency Photovoltaic Devices, 21 J.Elec.Mat. 347 (1992), disclose GaAs p-n junction solar cells situated on Ge substrates.

SUMMARY OF THE INVENTION

The present invention provides buried gate VFETs made of III–V semiconductor compounds on a germanium substrate. Preferred embodiments bury the gates by epitaxial overgrowth including overgrowth on untilted (100) oriented substrates and over locally disconnected structures (such as gate fingers and a connection rail), followed by doping to connect the locally disconnected structures together.

The use of a Ge substrate with epitaxial III–V for VFET structure has advantages including greater substrate strength so thinner and larger substrates can be used which lowers series resistance and permits use of larger wafers during processing; and ohmic contacts to Ge are easier to form than to III–V compounds and Ge can be heavily doped to lessen series resistance.

BRIEF DESCRIPTION OF THE DRAWINGS

The drawings are schematic for clarity.

DESCRIPTION OF THE PREFERRED EMBODIMENTS

First Preferred Embodiment VFET

Figure 1A:
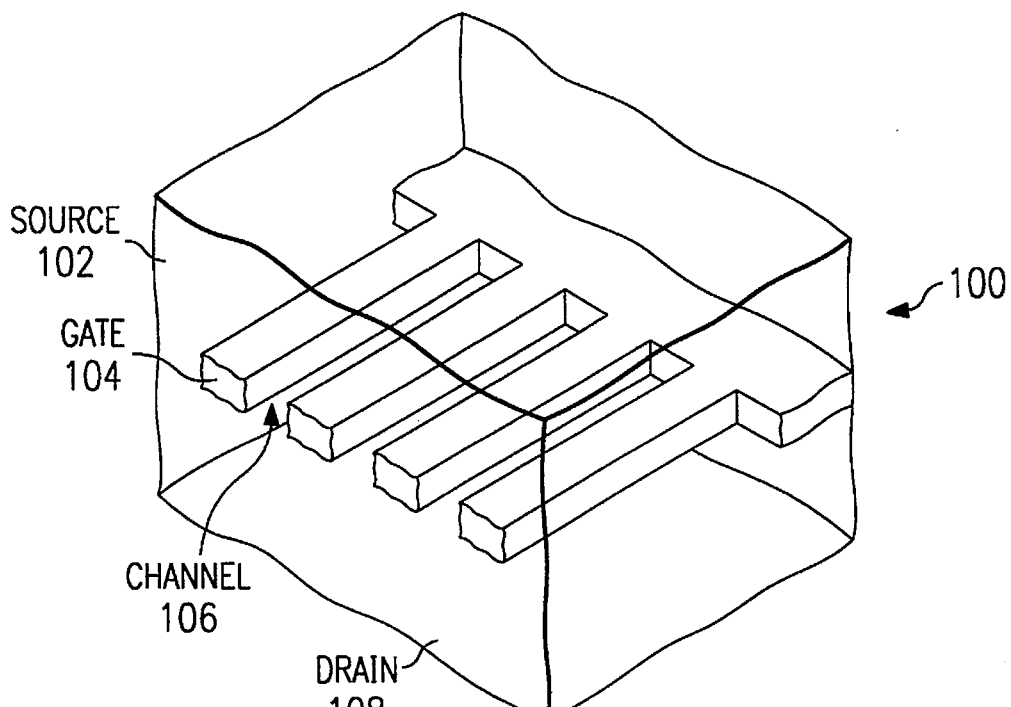
FIGS. 1a–c are perspective and cross-sectional elevation and plan views of a first preferred embodiment vertical field effect transistor.
Figure 1B:
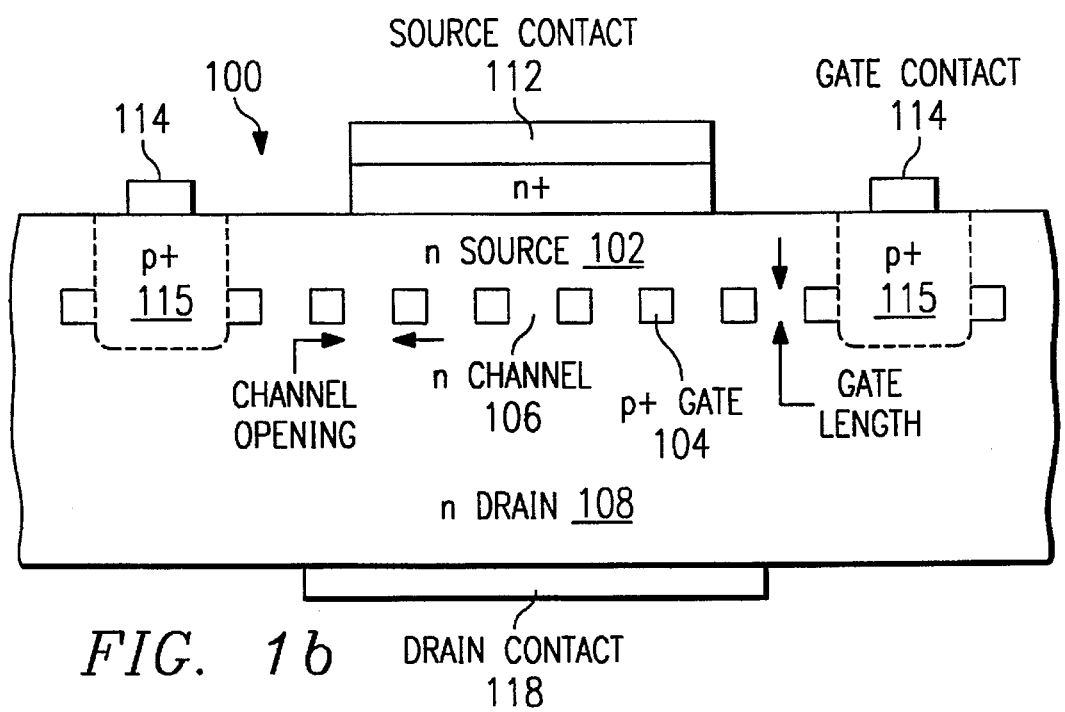
Figure 1C:
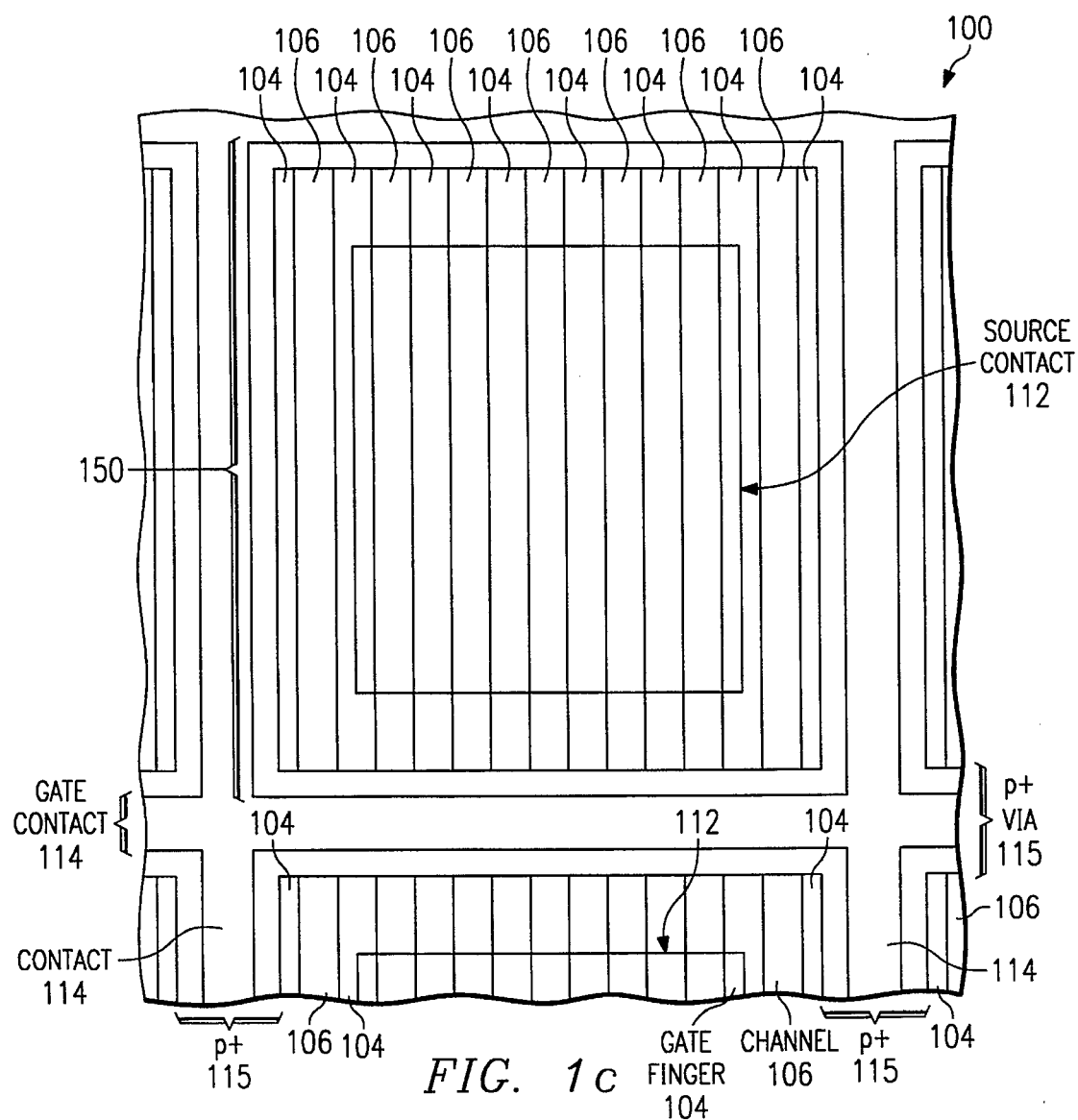

FIG. 1a shows in cutaway perspective view a first preferred embodiment vertical field effect transistor (VFET), generally denoted by the reference numeral 100, made of gallium arsenide (GaAs) and including n doped source 102, p+ doped gate 104 in the form of parallel fingers with n doped channel regions 106 between successive gate fingers, and n doped drain 108 which includes a drift region. FIG. 1b shows VFET 100 in cross sectional elevation view and also shows source contact 112, metal gate contact 114 which connects to gate 104 through doped via p+ region 115, and bottom drain contact 118. FIG. 1c heuristically shows a plan view and indicates that the array of parallel gate fingers and channels can be repeated to increase total gate and channel width while retaining low gate resistance because of the gate metal around each repeated cell 150. Alternatively, the drain contact could be taken to the top surface analogous to the collector in a vertical bipolar transistor structure; this would also permit use of a high resistivity substrate and integration of other devices without a common drain. Note that for clarity FIGS. 1b–c show only seven channel regions 106 between adjacent parallel p+ regions 115; more typically there would be about 100–200 channel regions between adjacent parallel p+ regions, and the overall size of the rectangular areas surrounded by p+ 115 would be 100 μm by 200 μm. The use of metal gate contact 114 strapping the entire p+ region 115 lowers the gate resistance for high frequency operation.

VFET 100 has the structure of parallel junction field effect transistors (JFETs) with current flowing vertically in FIGS. 1a–b. With a positive voltage $V_{DS}$ applied from drain to source, majority carrier electrons flow from source 102 through channel regions 106 to drain 108; and a voltage $V_{GS}$ applied to gate 104 (reverse bias of the p-n junction) controls this flow by modulating the carrier levels in channel regions 106. The gate length equals the channel length plus the associated p-n depletion region and is the vertical distance indicated in FIG. 1b. The channel opening is the distance between adjacent gate fingers as shown in FIG. 1b. VFET 100 has a channel length of 0.3 μm and a channel opening of 0.5 μm with a channel doping concentration of $3\times10^{16}$ atoms/cm$^3$.

Figure 2A:
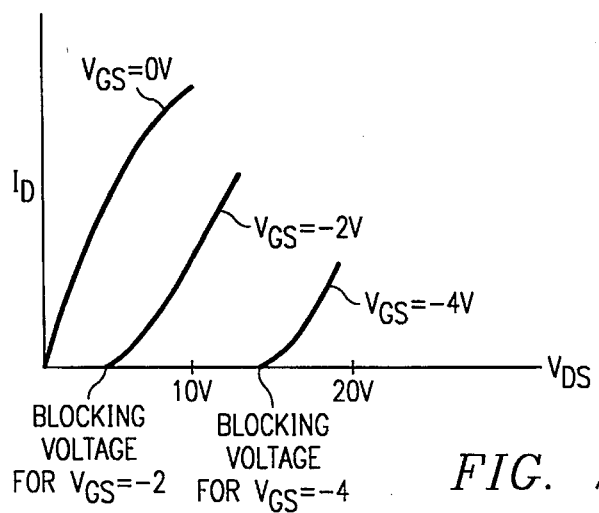
FIGS. 2a–c show electrical characteristics and behavior of the first preferred embodiment.

FIG. 2a illustrates the electrical characteristics of VFET 100. For $V_{GS}$ equal to 0, the depletion region of the p-n junction formed by gate 104 and channel 106 takes up about half of channel 106, and the drain current $I_D$ is proportional to $V_{DS}$ for small $V_{DS}$ and flows through the undepleted neutral central portion of channel 106. The ratio $I_D/V_{DS}$ is called the on-resistance $R_{ON}$ and depends upon the channel material, geometry, doping level, substrate resistance, and contact resistance. The channel material resistivity equals roughly 25 micro-ohm-cm$^2$ for VFET 100 while for the entire VFET it is roughly 50–100 micro-ohm-cm$^2$.

As $V_{GS}$ becomes negative and increases in magnitude, the neutral central channel portion begins to pinch off due to the reverse bias of the gate-channel junction, and the drain current pinches off. This represents the standard triodelike operation of a vertical JFET. Power switching applications only use turned-on and turned-off states of VFET 100. $V_{GS}=0$ (or $V_{GS}$ positive to forward bias the gate-channel junction for current injection) will turn on VFET 100 and $I_D$ will be large and $V_{DS}$ will be small; whereas, $V_{GS}$ large (negative) will turn off VFET 100 and $I_D$ will be a leakage current and $V_{DS}$ will be large. Thus the saturated current regime of pentodelike operation of a JFET will not typically be used.

Figure 2B:
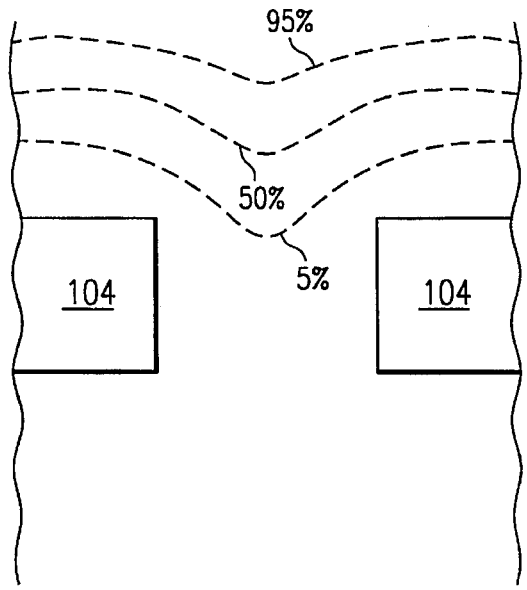
Figure 2C:
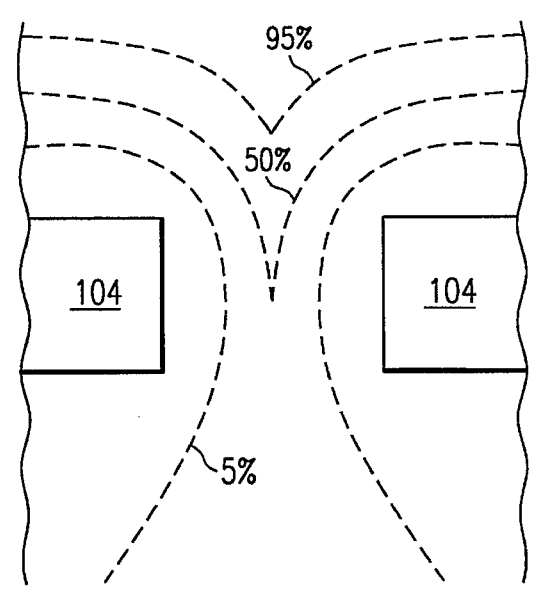

With $V_{GS}=-2$ volts the gate-channel junction depletion regions fill up channels 106 and this allows only leakage drain current $I_D$ until $V_{DS}$ reaches a certain minimum value (the blocking voltage). Further increases in $V_{DS}$ beyond the blocking voltge cause a rapid increase in drain current. The drain current follows a space charge limited dependence on $V_{DS}$ and thus VFET 100 exhibits triodelike operation. Increasing $|V_{GS}|$ increases the blocking voltage, and the ratio of blocking voltage to $|V_{GS}|$ is the DC blocking gain. VFET 100 has a DC blocking gain of roughly 3 to 20 for $V_{DS}$ in the range of 5 to 50 volts. Very high blocking voltages require long gates and large opening channels (large channel length to opening ratios) and reduced channel doping levels to limit the influence of $V_{DS}$ on the channel depletion regions and prevent the space charge limited current. Also high blocking voltages require large drains (drift regions) with low doping levels to support the large potential drop without avalanche breakdown. FIGS. 2b–c heuristically illustrate the channel carrier concentrations as a percentage of the undepleted channel carrier concentration for $V_{GS}$ equal to −3 volts and with $V_{DS}$ below the blocking voltage and above the blocking voltage, respectively.

VFET Applications

Figure 3A:
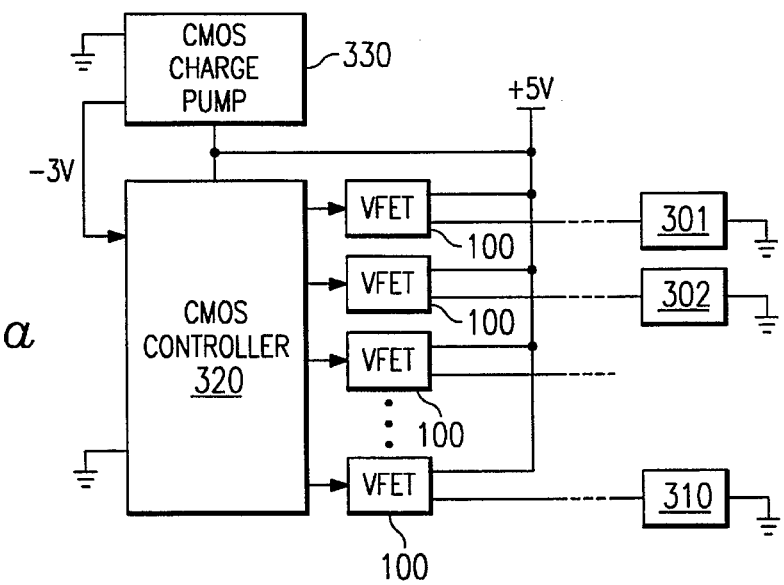
FIGS. 3a–d illustrate applications of the first preferred embodiment.

VFET 100 provides high frequency switching by low gate capacitance and low gate resistance through high gate doping levels and low channel doping levels plus small gate dimensions. FIG. 3a heuristically shows multiple VFET 100s with their drains all connected to a power supply $V_{DD}$ at +5 volts, with their sources connected to various devices 301, 302, . . . 310, and with their gates driven by controller 320. Thus controller 320 controls the power supply to each of devices 301, 302, . . . 310. Because VFETs 100 require a negative gate voltage to turn off, controller 320 has charge pump 330 to provide −3 volts. Both controller 320 and charge pump 330 could be CMOS circuits. The arrangement of FIG. 3a could be employed in battery powered systems such as portable computers where the devices 301, 302, . . . 310 would be items such as disk drives, keyboards, screens, CPUs, modems, and so forth with controller software controlled and interrupt driven to turn off all items not in use but quickly turn on items upon demand for use. Such power management will extend the charge life of a battery operating the portable computer, and the low voltage levels (e.g., down to 3.3 or even 1.5 volts) require a low $R_{ON}$ plus the high CPU frequencies (50 MHz) require rapid power switching.

Figure 3B:
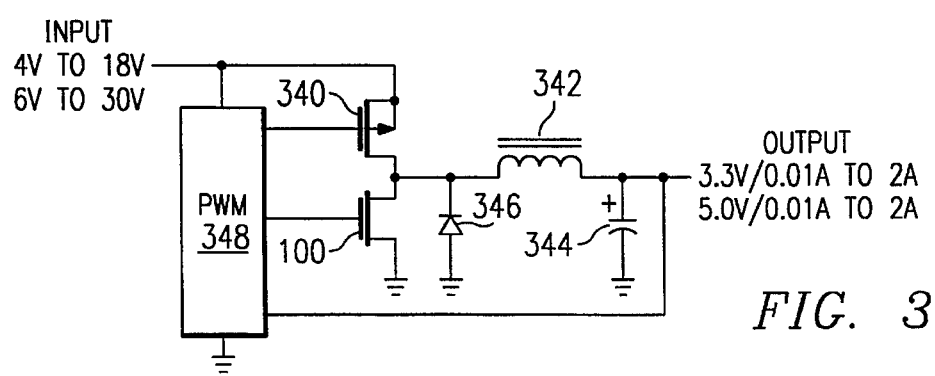

FIG. 3b shows a preferred embodiment switching voltage regulator including p-channel FET 340, lowpass filter made of inductor 342 and capacitor 344, flee-wheeling diode 346, VFET 100, and pulse width modulator plus controller 348. This regulator has the "buck" topology and basically operates as follows. Controller 348 switches FET 340 at a fixed frequency (e.g., 100 KHz) and senses the output voltage to control the duty cycle of the switching of FET 340; this feedback sets the output DC voltage. The lowpass filter filters the resulting square wave from FET 340 to produce a ripple free DC output. Controller 348 includes a charge pump to generate negative gate voltage for VFET 100 and turns on VFET 100 when FET 340 is turned off; thus VFET 100 provides a low resistance path to ground and prevents the output node of FET 340 from going negative during the portion of the switching cycle in which FET 340 is turned off. Free-wheeling diode 346 parallels VFET 100 and provides the same function; however, free-wheeling diode 346 would cause a diode voltage drop, and without VFET 100 the average output DC current would pass through free-wheeling diode to cause power losses. VFET 100 provides a lower resistance path for the average DC current and eliminates the diode voltage drop and its attendant power losses.

Figure 3C:
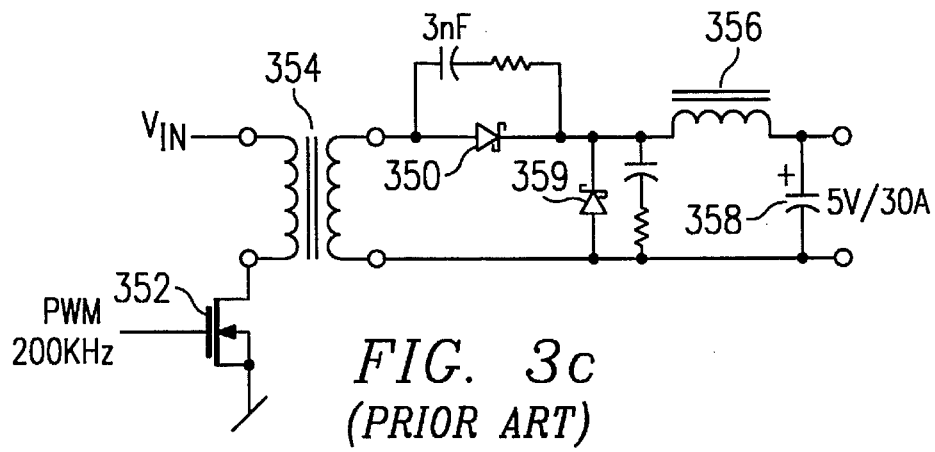
Figure 3D:
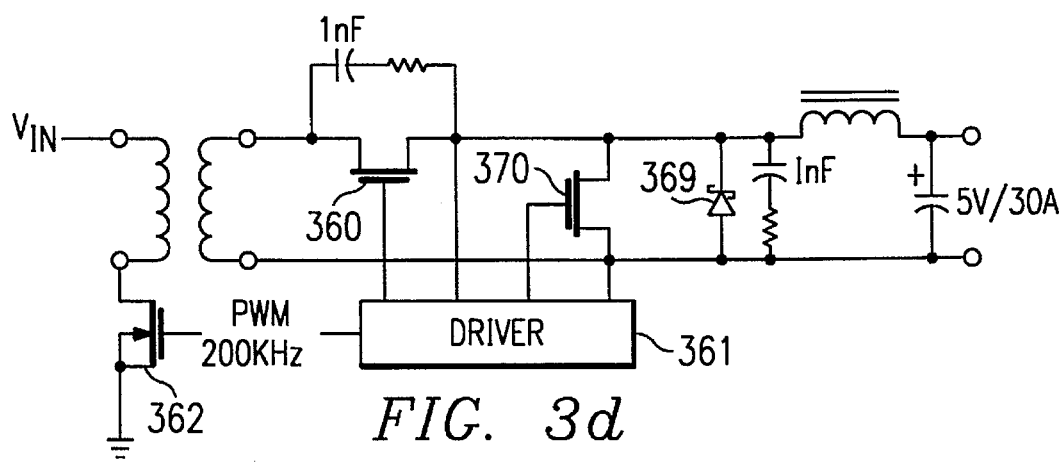

FIG. 3c illustrates a known DC-DC converter including a Schottky diode 350 for rectification. The converter operates in somewhat the same manner as the regulator of FIG. 3b: a pulse width modulator switches n-channel FET 352, and transformer 354 steps up (or down) the voltage of the resulting square wave. The lowpass filter made of inductor 356 and capacitor 358 filters the rectified square wave, and free-wheeling diode 359 prevents an overly negative filter input node. FIG. 3d shows a preferred embodiment DC-DC conveter with synchronous rectification by VFET 360 driven by driver 361 to be synchronized with the switching of FET 362 and with VFET 370 parallel flee-wheeling diode 369. The converter of FIG. 3d operates analogous to the converter of FIG. 3c but with rectifying diode 350 replaced by the synchronous VFET 360 to avoid the diode voltage drop and attendant power losses and also with VFET 370 providing a low resistance path parallel flee-wheeling diode 369 (analog of diode 359) to avoid its power losses.

First Preferred Embodiment Method of Fabrication

A preferred embodiment method of fabrication of VFET 100 for low voltage operation (a blocking voltage of 20 volts for a gate-to-source bias of −3 volts) uses a low resistivity substrate and backside drain contact and includes the following steps:

(a) Begin with a 25-mil thick (100)-oriented (to ±0.5°) GaAs wafer n++ doped with silicon to a level of about $2-4\times10^{18}$ atoms/cm$^3$. The substrate has true (100) orientation and does not have an orientation tilted 2° from (100) as is typically done to insure smoother epitaxial layer growth. Epitaxially grow by metalorganic chemical vapor deposition (MOCVD) the following layers of GaAs:

| Thickness | Doping type | Atomic concentration |
| --- | --- | --- |
| 1.0 μm | n++ | $2 \times 10^{18}$/cm$^3$ |
| 1.0 μm | n− | $3 \times 10^{16}$/cm$^3$ |
| 0.3 μm | p++ | $1 \times 10^{20}$/cm$^3$ |

Figure 4A:
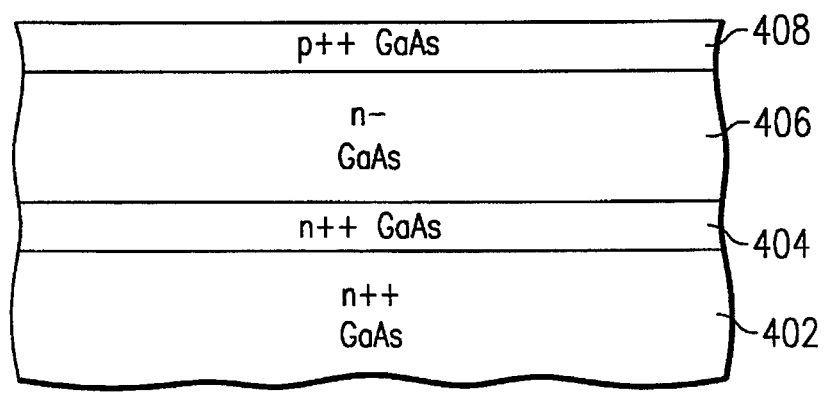
FIGS. 4a–m show steps in a first preferred embodiment method of fabrication.

The MOCVD uses trimethyl gallium (or equivalent such as triethyl gallium) and arsine (or equivalent such as tertiary-butyl arsine or trimethyl arsine) plus disilane (or equivalent) for n-type doping and CCl$_4$ (or equvalent) for p-type doping. See FIG. 4a for a cross sectional elevation view showing substrate 402, n++ epilayer 404, n− epilayer 406, and p++ gate layer 408.

Figure 4B:
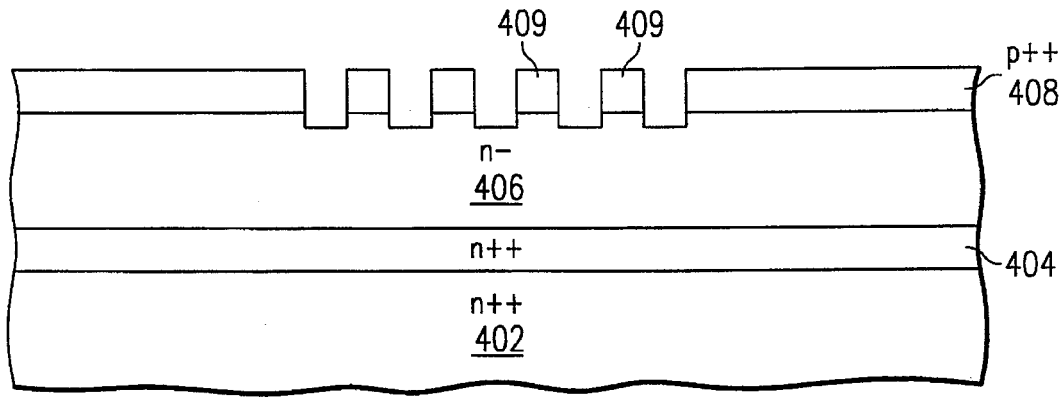
Figure 4C:
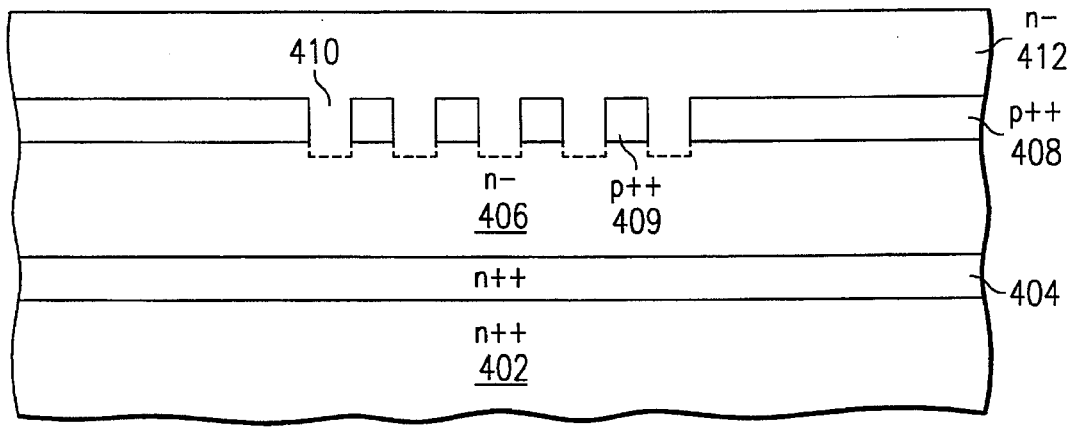
Figure 4D:
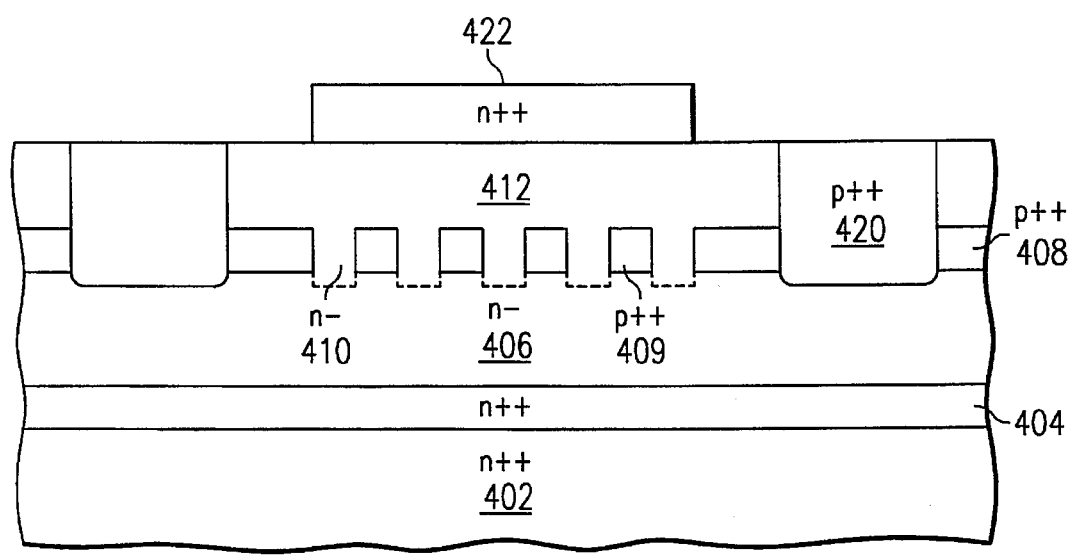
Figure 4E:
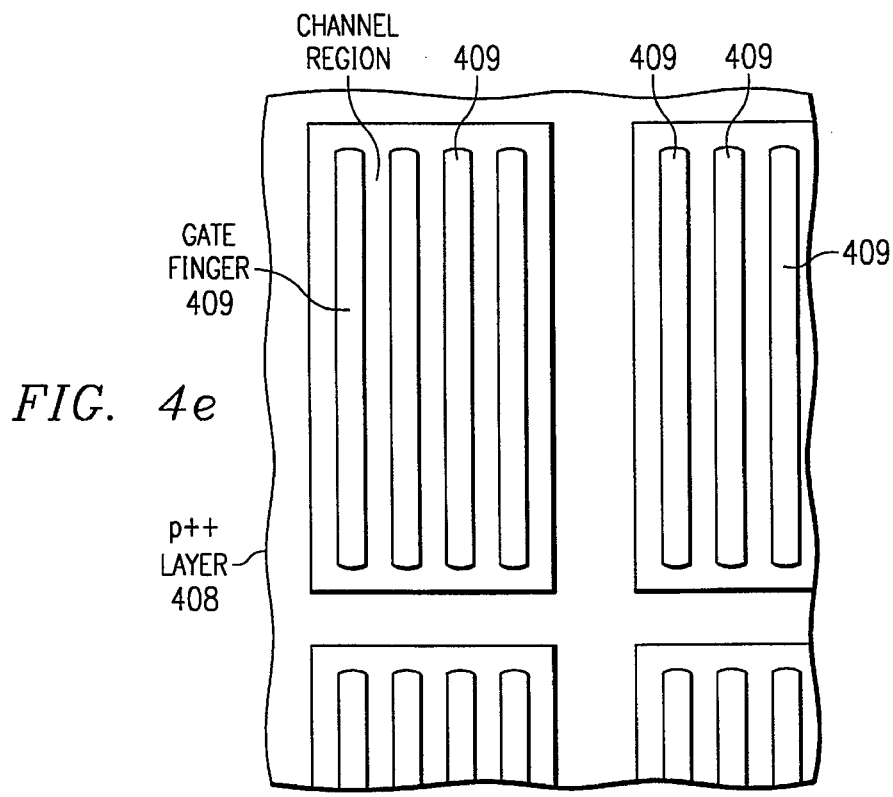
Figure 4F:
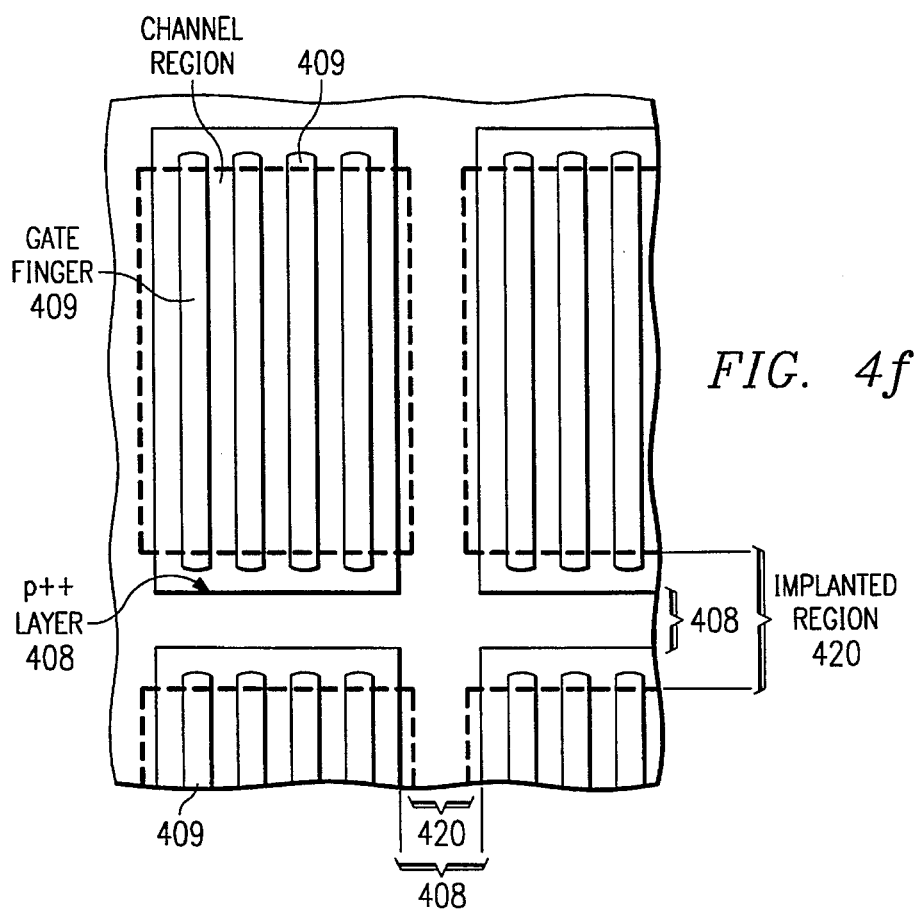
Figure 5A:
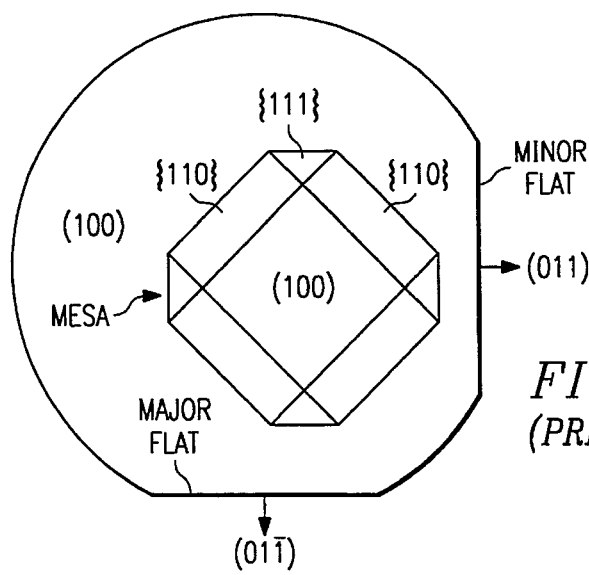
FIGS. 5a–c are plan views of semiconductor substrates illustrating a step of the preferred embodiment method of fabrication.
Figure 5B:
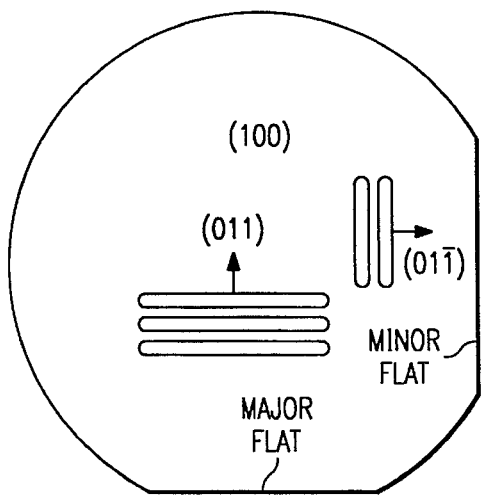

(b) Spin on photoresist and pattern it to define 200 gate fingers 409 in each cell, and then etch with an electron cyclotron resonance (ECR) chlorine-based plasma etch using the patterned photoresist as the etch mask, and then strip the patterned photoresist. See FIG. 4b for the cross sectional elevation view (showing only four gate fingers for clarity) and FIG. 4e for the corresponding plan view which also includes portions of three other cells. The channel regions between adjacent gate fingers 409 resemble a series of parallel slots connected by a perpendicular slot at each end in epilayer 408. The gate fingers are 0.3 μm long (thickness of layer 408) by 0.5 μm thick by 100 μm wide with 0.5 μm channel openings between adjacent gate fingers. The gate fingers are separated from the surrounding region in p++ layer 408 by a gap of about 0.5 μm, and the width of p++ layer 408 between cells is about 2 μm in the direction parallel to the gate fingers and about 1 μm in the direction perpendicular. Overetching removes about 0.1 μm of n− layer 406 as suggested in FIG. 4b. The preferred embodiment method of fabrication aligns the gate sidewalls with particular crystal planes; FIGS. 5a–b and the accompanying discussion detail this alignment. The gate finger thickness minimum depends upon the resistivity of layer 408, and the channel region opening maximum derives from the gate bias for maximum blocking voltage plus the doping level of the channel region. A higher breakdown voltage (about 35 volts) version of VFET 100 would use 1.5 μm channel opening with a n− doping level of $1\times10^{16}$/cm$^3$. A larger channel length (thickness of p++ layer 408) would increase the blocking voltage up to breakdown limits. The channel length can be varied from 0.1 μm to greater than 1 μm. Note that locally trenches between gate fingers can also be viewed as gate finger pedestals on an underlying plane. FIGS. 4e–f show a layout that results in gate pedestals because each gate finger has a free standing end. The pedestal ends are electrically connected up by a later p+ implantation. If the gate fingers directly connect to the remainder of p++ layer 408, then the etched channel area looks like a slot rather than the edge of a pedestal.

Figure 6A:
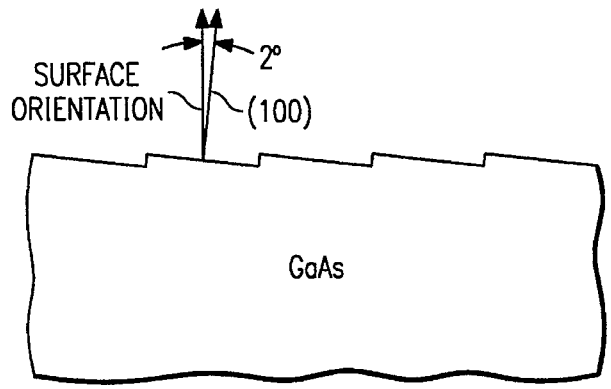
FIGS. 6a–b show oriented substrates and epitaxial growth.
Figure 6B:
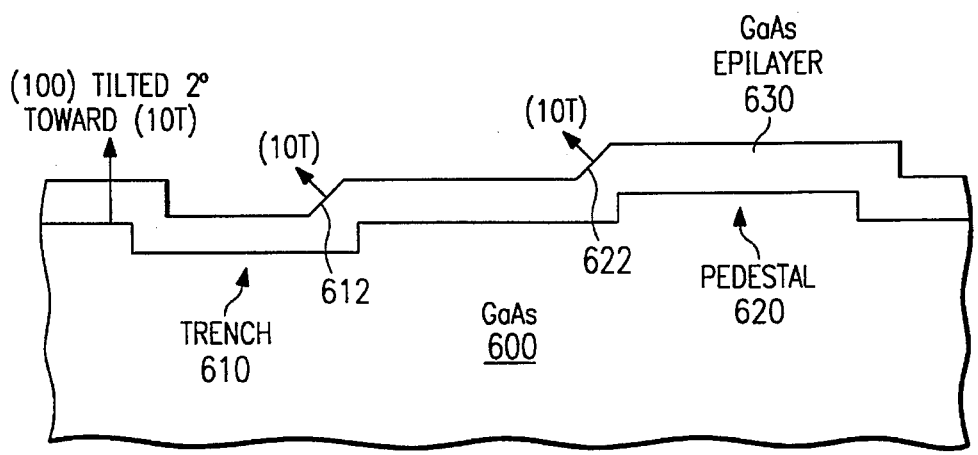

(c) Epitaxially grow an n− GaAs layer both to fill the spaces (channel regions 410) between and around the gate fingers and continue growing to form source 412 of thickness 1.0 μm on gate fingers 409. The spaces between and around the gate fingers fill by growth both from the bottom of the spaces (layer 406) and from the vertical sidewalls. Of course, growth from the top of layer 408 occurs during this filling, but the pattern of the gate fingers is lost and the surface becomes essentially planar after about 0.5 μm of growth on gate fingers 409 due to the on-axis orientation of the wafer. The epilayer has in situ doping with silicon to a level of $3\times10^{16}$ to $1\times10^{17}$ atoms/cm$^3$. See FIG. 4c. The lack of tilt in the orientation of substrate 402 affects the quality of the interface between the original gate sidewalls and the channel-region-filling newly grown GaAs material. FIGS. 6a–b and the accompanying discussion below indicate the tilt effect.

(d) Implant Be to make p+ connection 420 from etched p++ epilayer 408 to the surface of epilayer as shown in FIG. 1. FIG. 4f shows the implant in plan view; the implant extends about 1 μm into the channels for a total width of about 4 μm in the direction parallel the gate fingers and is confined to the p++ layer in the direction perpendicular to the gate fingers. (In place of the p+ implant a mesa etch down to layer 408 could be done for the gate contact.) Then grow and pattern n++ epilayer 422 to make contact to n− source 412. Addition of metal contacts, encapsulation, and packaging completes a basic discrete VFET suitable for low voltage power regulation. FIG. 4d illustrates the essential structure. Metal contacts to the n+ GaAs for source and drain may be made of an alloy such as PdGeIn, AuGeNi, PdGe, TiPtAu (if layer 422 is n++ InGaAs), and so forth, and the p+ metal contact may be an alloy such as AuZn, AuBe, and AuMn.

Figure 4G:
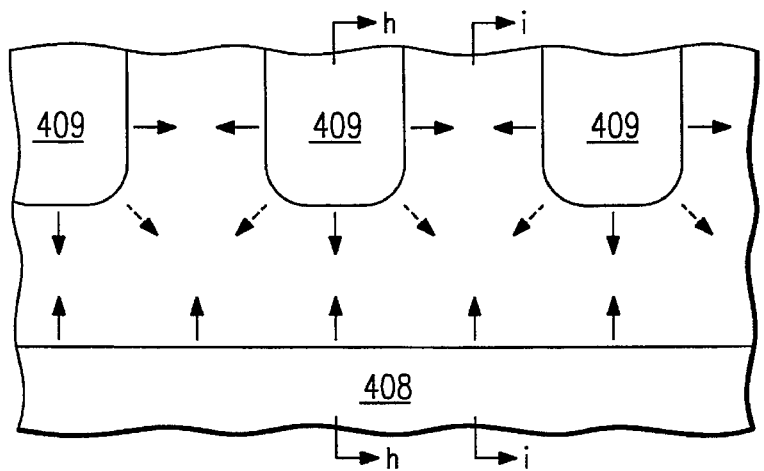
Figure 4H:
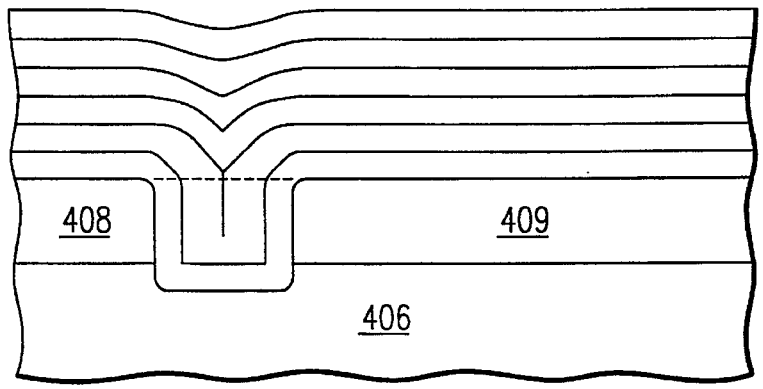
Figure 4I:
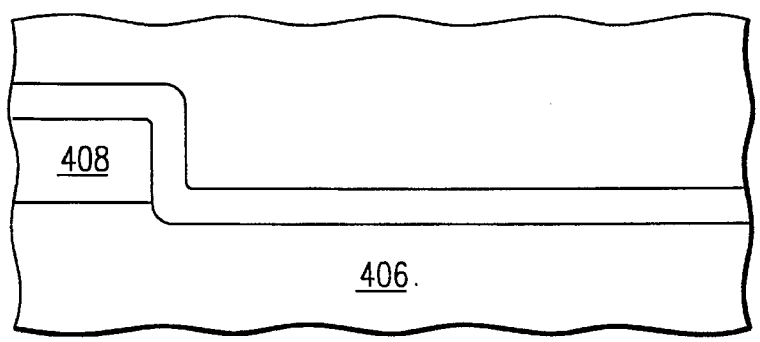

FIGS. 4g–i illustrates the direction of epilayer growth of step (c) in a plan and two cross sectional elevation views for the region about the ends of gate fingers 409. FIGS. 4h–i are along section lines h—h and i—i of FIG. 4g, respectively. When the gates/channels are defined so that the gates look like pedestals (free standing ends) then the epilayer overgrowth at the ends is fairly smooth. Note that gate fingers 409 have slightly rounded corners due to the limits of the lithography and the anisotropy of the etching, and thus the crystal planes from which the epilayer grows vary at the gate finger ends. This leads to defects and doping irregularities which propagate with the epilayer growth but towards layer 408; see the broken arrows in FIG. 4g. FIGS. 4h–i heuristically shows successive epilayer surfaces during growth and the defect propagation. The defect region falls within the region implanted in step (d) and thus lies outside of the channels 410 and source region 412. Hence, these overgrowth defects do not affect performance of VFET 100.

Figure 4J:
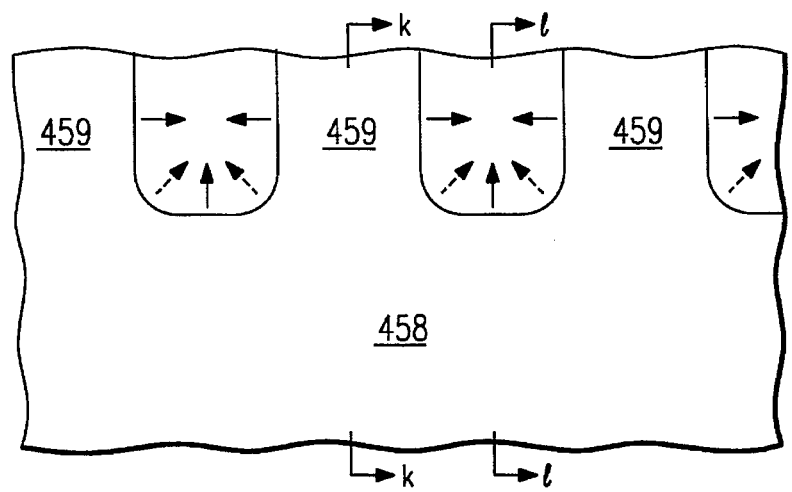
Figure 4K:
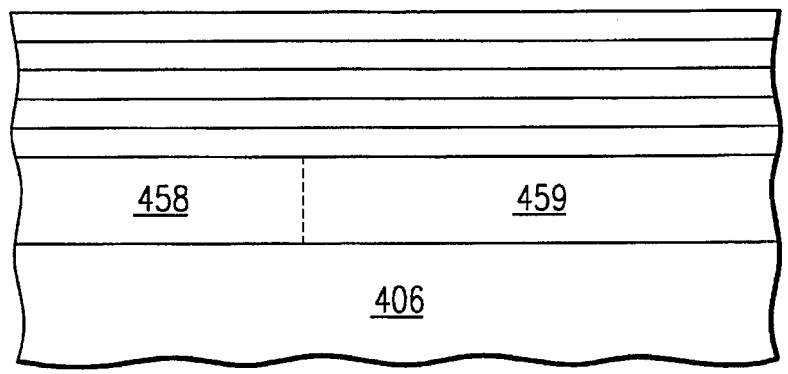
Figure 4L:
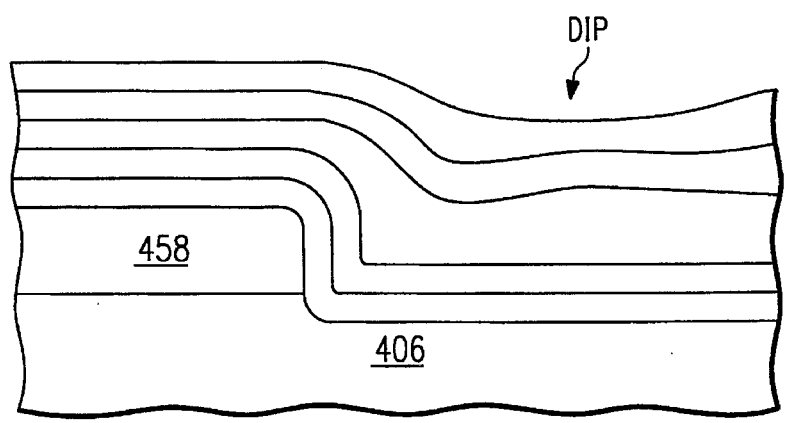

In contrast, FIG. 4j illustrates in plan view gate fingers 459 connected to the remainder of p++ layer 458 in order to nominally lower gate resistance. When the gates/channels are defined so that the channel looks like a slot (gate is continuous) then the epilayer overgrowth at the the ends has defects and a large dip. In this case the growth from the rounded corners extends away from the region to be implanted and towards the channels of the VFET; see the broken arrows in FIG. 4j. FIGS. 4k–l show the cross sectional elevation views along section lines k—k and l—l of FIG. 4j. The defects generated at the corners propagate rapidly into the channels: although the epilayer growth has a total thickness on the gate fingers of 1 μm, the defects affect growth and a dip over each channel of length up to 5 μm can be the result as illustrated in FIG. 4l. Hence, to avoid the leakage and performance degradation due to these defects, the implanted area would have to be expanded by about 3–5 μm into each cell to encompass the defect/dip area. This decreases the conduction channel area and thus increases the on resistance $R_{ON}$ of such a VFET.

Figure 4M:
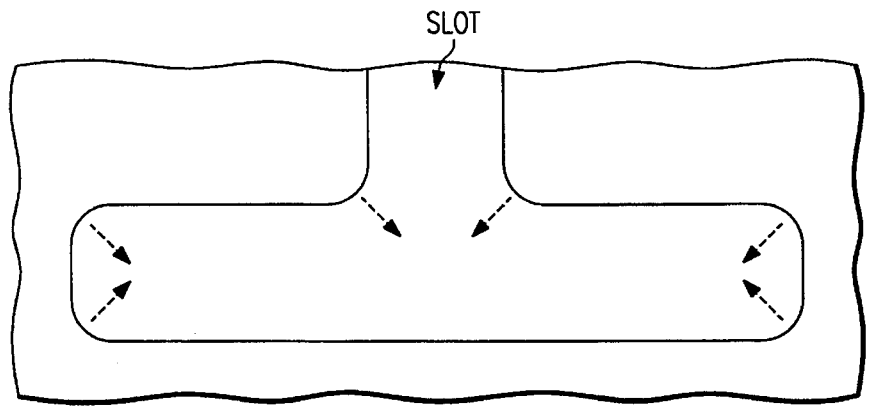

FIG. 4m illustrates the fact that the proper directional growth may also be obtained with only a locally disconnected structure. In particular, a single slot of FIG. 4j could be expanded into a "T" shape to yield orientations which avoid defect propagation into the slot by essentially trapping the defect directions in the top of the "T".

Gate Orientation

FIG. 5a shows a standard (100)-oriented GaAs wafer in plan view and illustrates the major and minor flats which are oriented 45° to the [010] and [001] directions and represent (011) and (01-1) oriented cleavage planes. An anisotropic wet etch such as $H_2SO_4$, $H_2O_2$, and $H_2O$ in the ratio 1:8:40 preferentially does not etch (111)Ga planes. Thus a GaAs wafer subjected to an anisotropic wet etch with square etch mask leads to a raised mesa having face orientations as illustrated. Note that the wafer surface orientation tyically has a 2° tilt from precisely (100) for good growth of thick epilayers.

When gate layer 408 has gate fingers 409 formed as elongated regions parallel to either the major or minor flat of substrate 402 (see heuristic FIG. 5b in which the gate finger sidewalls are perpendicular to the plane of the Figure), then plasma etching yields gate sidewalls as {110} planes. These are the cleavage planes and the typical orientation. However, with this orientation for the gate finger sidewalls, the in situ doping MOCVD growth from the sidewalls incorporates the silicon dopants during growth of {110} or higher index planes and this leads to VFETs with poor performance which may be due to the silicon (which is an amphoteric dopant) also acting as an acceptor and yielding p type channel doping or the growth on {110} and higher index planes creating much higher crystal defect levels than growth on {100} planes. Such an incorrect doping or high defect levels in the portion of the channel abutting the gate smears out the p-n junction or provides leakage current paths and leads to poor depletion region control and low voltage gain (or low DC blocking voltage).

Figure 5C:
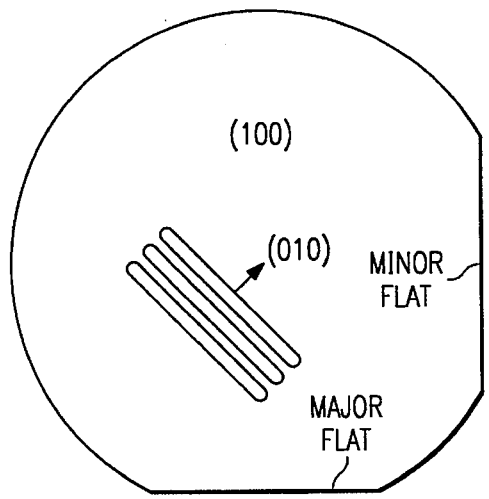

Preferred embodiment (010) or (001) orientation of the gate finger sidewalls as shown in FIG. 5c yields incorporation of the in situ silicon dopants during {100} plane growth and donor doping throughout the channel regions. In effect, the sidewalls have the same orientation as the original substrate. Of course, control of surface orientation to within 5° may be difficult for the sidewalls due to etch irregularities, but close to {100} will just be a tilted {100} plane and yield the proper donor silicon dopant incorporation.

Substrate Tilt

FIG. 6a illustrates in cross sectional elevation view the typical 2° tilt of the (100) orientation with atomic level terracing of a GaAs substrate for epitaxial growth. The atomic level terracing promotes smooth epilayer growth on a planar surface, whereas epilayer growth on untilted (100) surfaces has less uniform nucleation and yields slight ripples on the order of a few hundred angstroms in height after 1–2 μm of epilayer growth. The surface roughness for precise (100) oriented GaAs surfaces increases with epilayer thickness up to about 5 μm and then appears to saturate. Note that a 2° tilt with a crystal unit cell dimension of about 5.65 Å yields terrace widths of roughly 100–200 Å.

However, for the growth in step (c) to fill the spaces between the gate fingers, the 2° tilt must be avoided. In fact, it has been found that epitaxial growth to fill trenches and overgrow pedestals on a 2° tilted (100) surface leads to facets as illustrated in cross sectional elevation view by FIG. 6b. In particular, 0.7 μm thick epilayer 630 grown on substrate 600 with 0.5 μm deep and 4 μm wide trench 610 and 0.5 μm high and 4 μm wide pedestal 620 (both having sidewalls with essentially (100) orientation as described in the preceding section) led to ledge 612 in trench 610 and ledge 622 at pedestal 620. For a (100) oriented substrate with a surface orientation vector tilted in the (10-1) direction the ledges also have an orientation of (10-1). A ledge growth in the channel regions of a VFET leads to poor performance which may arise from crystal defects due to higher index plane growth (growth on the ledges) or incorrect dopant incorporation as described in the sidewall orientation section. Also, alignment marks (trenches or pedestals) for aligning subsequent etch masks appear shifted in epilayer 630 due to the ledges, and this complicates the fabrication process.

Consequently, the preferred embodiment uses a precisely (100) oriented (within a tolerance of 0.5°) substrate to avoid the ledges during overgrowth. This provides uniform filing of the channel between the gate fingers and uniform doping type in the channel. The use of untilted (100) oriented substrates of the preferred embodiment also avoids alignment mark shifting.

Second Preferred Embodiment VFET

Figure 7:
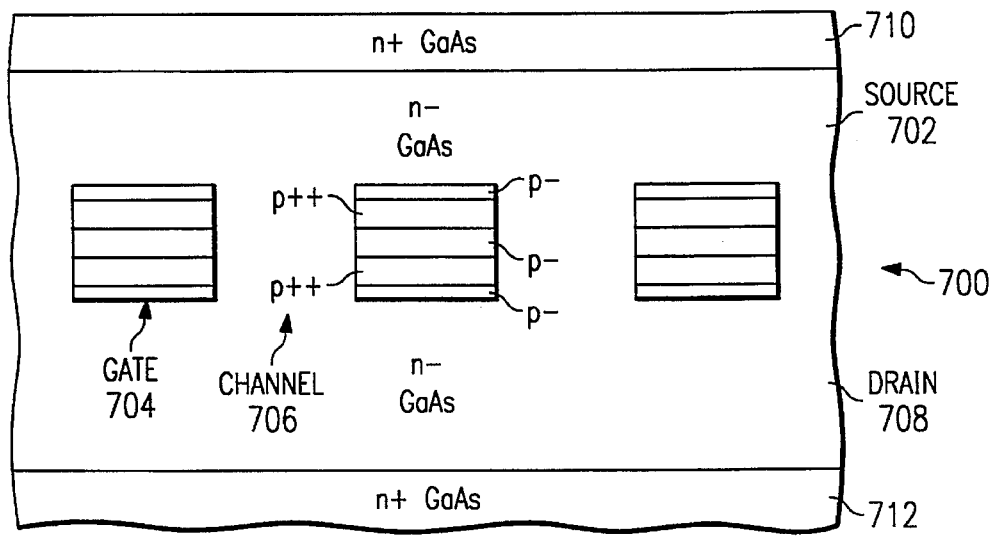
FIG. 7 illustrates in cross sectional view a second preferred embodiment.

FIG. 7 shows in cross sectional elevation view a second preferred embodiment VFET, generally denoted by the reference numeral 700, made of GaAs and including n doped source 702, p++/p– doped layered gate 704 in the form of parallel fingers with n doped channel regions 706 between successive gate fingers, n doped drain 708 including a drift region, n+ doped source contact 710 and n+ doped drain contact 712. VFET 700 resembles VFET 100 except for layered gate 704 which includes alternating layers of p++ and p– dopings. VFET 700 has the following dimensions: gate and channel region length 0.4 μm, gate finger breadth 0.5 μm, channel region opening 0.5 μm, source length 1 μm, and drain length 1 μm. The n– doping level of source 702, channel regions 706, and drain 708 is about $3 \times 10^{16}$ silicon atoms/cm$^3$. The carbon doping to make up gate 704 varies as follows with the 0.07 μm layer abutting the drain:

| Thickness | Doping type | Atomic concentration |
| --- | --- | --- |
| 0.07 μm | p– | $1 \times 10^{14}/cm^3$ |
| 0.1 μm | p++ | $1 \times 10^{20}/cm^3$ |
| 0.1 μm | p– | $1 \times 10^{14}/cm^3$ |
| 0.1 μm | p++ | $1 \times 10^{20}/cm^3$ |
| 0.05 μm | p– | $1 \times 10^{14}/cm^3$ |

Carbon dopants have a very small diffusivity in GaAs, and thus such thin layers can be fabricated by MOCVD without the dopant diffusion overwhelming the layering even upon annealing.

Figure 8A:
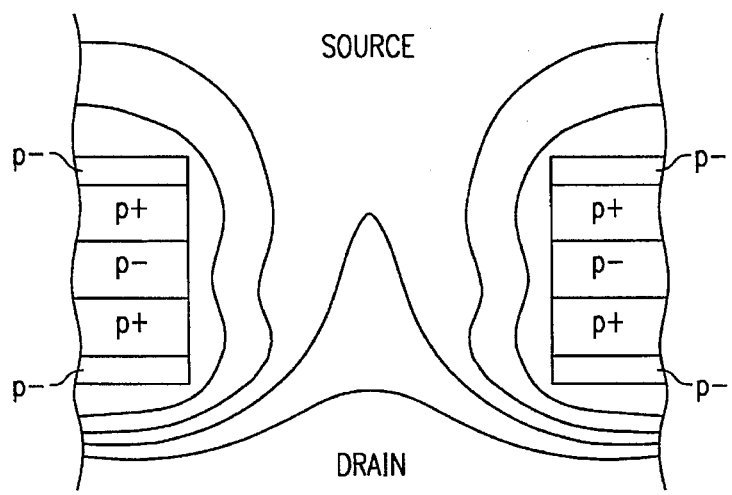
FIGS. 8a–b illustrate equipotentials of the second preferred embodiment.
Figure 8B:
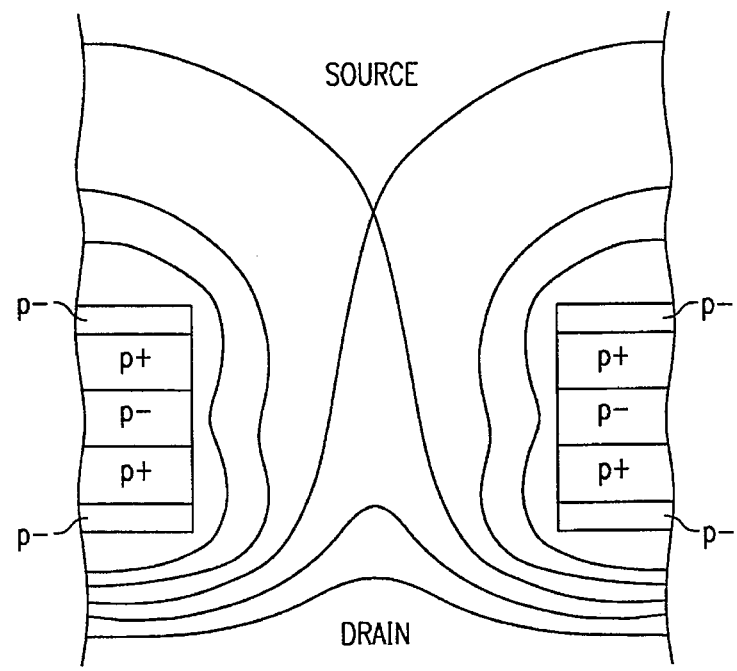

The layering of gate 704 along its length provides both low electric fields in channel regions 706 when no gate bias is applied (so the on-resistance $R_{ON}$ is low) and high electric fields with a reverse gate bias to have high blocking voltages and large blocking gain. FIGS. 8a–b heuristically illustrate the equipotential lines in the channel for –2 volt gate bias $V_{GS}$ with the drain to source voltage $V_{DS}$ just below blocking voltage in FIG. 8a and just above blocking voltage in FIG. 8b. The end p– layers reduce the corner electric field magnitude to increase the gate-to-drain breakdown voltage and reduce gate capacitance, and the middle p– layer flattens the equipotential surfaces in the channel regions and extends the high field saddle toward the drain. This flatter equipotential insures better drain potential blocking. Of course, the middle p– layer could be omitted for simpler fabrication and still retain the increase in breakdown voltage; or one or both of the end p– layers could be omitted and still retain the equipotential surface flattening.

Figure 9A:
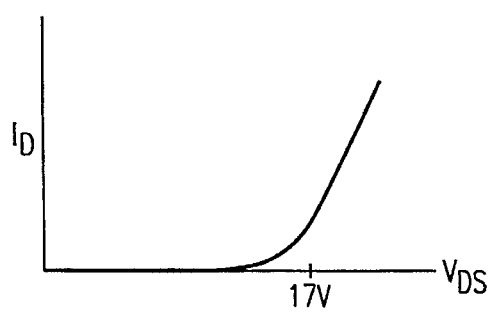
FIGS. 9a–b show electrical characteristics of the second preferred embodiment.
Figure 9B:
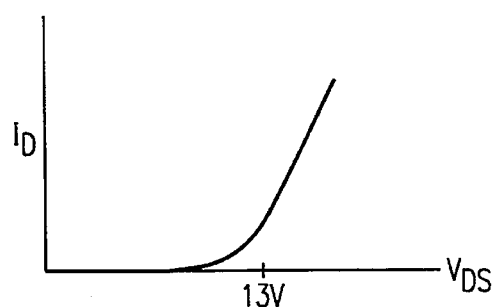

FIGS. 9a–b show the I–V characteristics for a gate bias of –2 volts; FIG. 9a for the VFET as shown in FIG. 7 and FIG. 9b for interchanged source and drain.

Gate 704 could include more layers, especially for longer gates, to further flatten the equipotential surfaces and improve the blocking voltage, but longer gates increase the on resistance $R_{ON}$. Additionally, the gate layers could be separated by an n– layer, and then individual contacts to the gate layers could create pentodelike characteristics for the VFET.

Furthermore, the layered gate could be used without the sidewall orientation or with a tilted substrate. Lastly, a gate with doping variation along its length could be used in horizontal field effect transistors. In such a horizontal case, a buried gate region could be a series of subregions with separate doping levels.

Third Preferred Embodiment VFET

Figure 10:
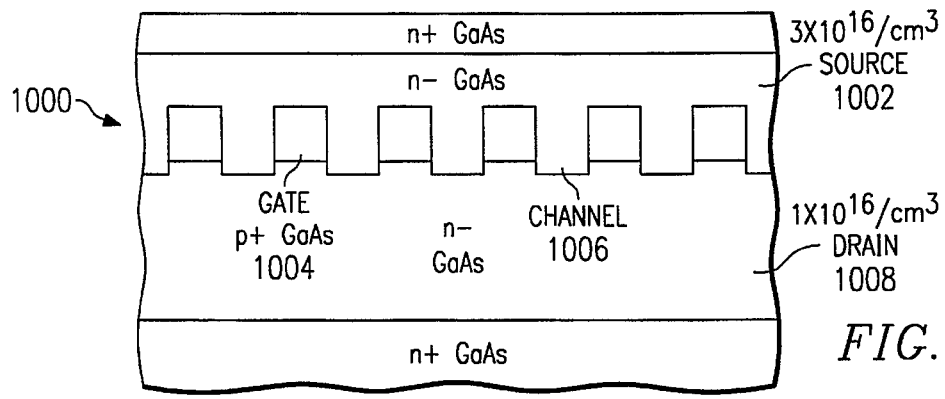
FIG. 10 is a cross sectional elevation view of a third preferred embodiment.

FIG. 10 shows in cross sectional elevation view a third preferred embodiment VFET, generally denoted by the reference numeral 1000, made of gallium arsenide (GaAs) and including n doped source 1002, p+ doped gate 1004 in the form of parallel fingers with n doped channel regions 1006 between successive gate fingers, and n doped drain 1008. VFET 1000 differs from VFET 100 with respect to source/drain doping levels; in particular, VFET 1000 has lighter drain doping, as follows.

| Region | Doping type | Atomic concentration |
| --- | --- | --- |
| Source | n– | $3 \times 10^{16}/cm^3$ |
| Channel | n– | $3 \times 10^{16}/cm^3$ |
| Drain | n– | $1 \times 10^{16}/cm^3$ |

The lighter doping of drain 1008 leads to a higher gate/substrate breakdown voltge, reduced gate/substrate capacitance, and higher blocking voltage by effectively increasing the channel length in that the channel depletion region extends deeper into the drain. It also decreases the effect of drain-source voltage $V_{DS}$ changes on the gate blocking because the integrated charge is less on the substrate side. Further, a channel openning of 0.8 μm with a channel doping level of $1 \times 10^{16}/cm^3$ has about the same blocking voltage with the same gate voltage as a channel opening of 0.4 μm with a channel doping level of $3–4 \times 10^{16}/cm^3$; however, the smaller channel opening with higher channel doping leads to a lower on resistance $R_{ON}$. Thus the difference in channel and drain doping levels yields VFETs with better performance. The p+ gate layer 1004 can also have p– layers on both source and drain sides to minimize capacitance.

Fourth Preferred Embodiment VFET

Figure 11:
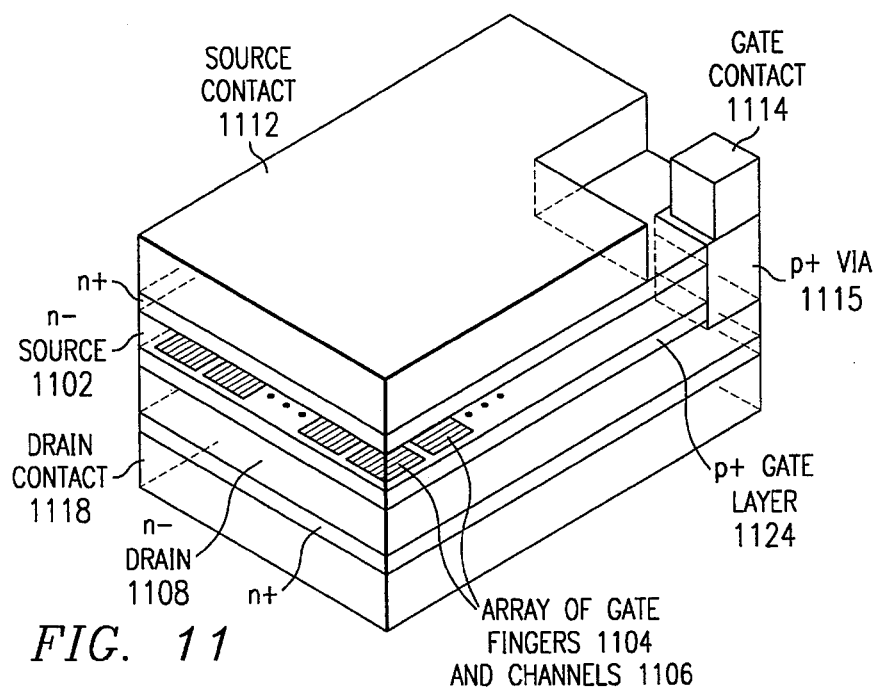
FIG. 11 is a perspective view of a fourth preferred embodiment.

A fourth preferred embodiment VFET combines the layered gate 704 of VFET 700 with the lightly doped drain 1002 of VFET 1000. And the fourth preferred embodiment VFET adpated for low frequency use may have the simpler layout shown in heuristic perspective view in FIG. 11. FIG. 11 shows p+ gate layer 1124 connected by a single doped via 1115 in a corner of the integrated circuit die to metal gate contact 1114 with all of the channels 1106 between gate fingers 1104 formed in layer 1124. The gate fingers are formed in repeated areas approximately 50 μm square which limits the gate finger width and gate resistance. The use of a single gate contact 1114 reduces the die area devoted to contacts and permits a maximal portion of gate layer 1124 to be patterned as gate fingers and channels.

Heterostructure VFET and HBT

Figure 12:
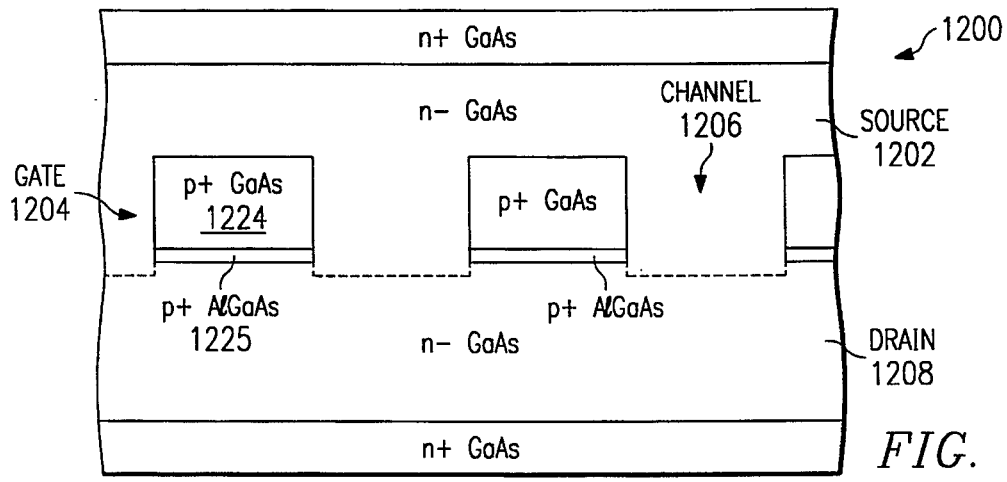
FIG. 12 illustrates in cross sectional view a fifth preferred embodiment.

FIG. 12 shows in cross sectional elevation view a portion of fifth preferred embodiment VFET 1200 which includes source 1202, gate fingers 1204, channels 1206, and drain 1208. All of these regions are made of GaAs except gate fingers 1204 are made of 0.3 μm thick p+ GaAs sublayer 1224 plus 0.05 μm thick p+ $Al_{0.3}Ga_{0.7}As$ sublayer 1225. The incorporation of sublayer 1225 provides a heterojunction from gate 1204 to drain 1208 and thereby increase gate-drain breakdown voltage and decrease leakage current.

Alternatively, gate 1204 could be entirely p+ $Al_{0.3}Ga_{0.7}As$ (0.3 μm thick) or be p+ $Al_{0.3}Ga_{0.7}As$ with a thin GaAs top sublayer to aid in the n– GaAs overgrowth forming source and channels. The $Al_{0.3}Ga_{0.7}As$ gate would also form a heterojunction with the channel and lessen gate-channel junction leakage.

Fabrication of VFET 1200 and variants proceeds as with VFET 100 with the addition of growth of a p+ $Al_{0.3}Ga_{0.7}As$ layer; the plasma etch to form the gate fingers also etches $Al_{0.3}Ga_{0.7}As$. Again, the fabrication process benefits from precise (100) orientation of the wafer and (010) and (001) orientation of the gate finger sidewalls. Of course, VFET 1200 could have modulated gate doping like VFET 700 and a lightly doped drain like VFET 1000.

Figure 13:
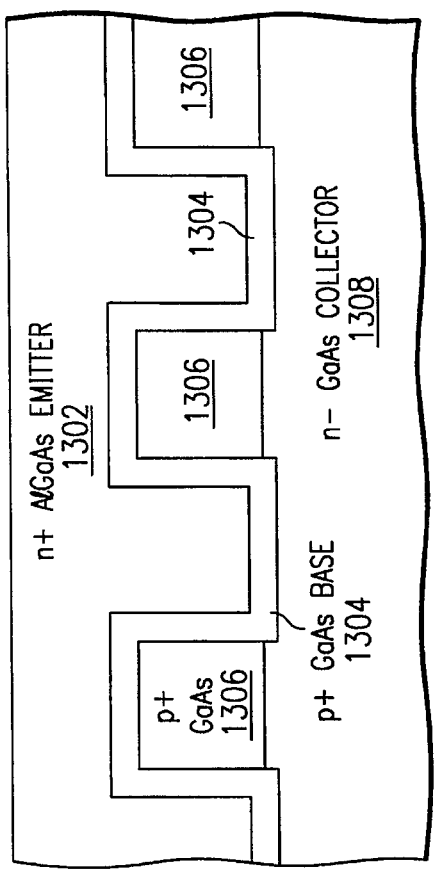
FIG. 13 shows in cross sectional view a sixth preferred embodiment.

FIG. 13 shows in cross sectional elevation view a portion of sixth preferred embodiment heterojunction bipolar transistor (HBT) 1300 which includes n+ $Al_{0.3}Ga_{0.7}As$ emitter 1302, p+ GaAs intrinsic base 1304, p+ extrinsic base 1306, and n– GaAs collector 1308. Extrinsic base 1306 has a finger structure analogous to gate fingers of VFET 100, although the number of fingers may be much smaller and the finger size larger. In particular, extrinsic base fingers 1306 could have a cross section of 2 μm by 2 μm to minimize the base resistance, whereas intrinsic base 1304 may have a thickness of 0.1 μm and a distance between adjacent extrinsic base fingers of 3 μm.

Fabrication of HBT 1300 may proceed analogous to that of VFET 100 but with the n– GaAs overgrowth forming the channels and source replaced by a 0.05 μm thick growth of p+ GaAs (in situ carbon doping) to form the intrinsic base and then a 0.5 to 1.0 μm thick n+ $Al_{0.3}Ga_{0.7}As$ (in situ silicon doping) growth to form the emitter. The p+ GaAs overgrowth to form the intrinsic base benefits from precise (100) orientation of the wafer to avoid any ledge beginning and the (010) and (001) orientation of the base finger sidewalls just replicates. The overgrowth of n+ $Al_{0.3}Ga_{0.7}As$ benefits from these orientations as did the n– GaAs in that the wafer orientation avoids the ledge formation and nonuniform fill of the emitter between the extrinsic base fingers and the extrinsic base sidewall orientation insures n type emitter doping. Note that silicon dopants have very small diffusivities in GaAs and $Al_{0.3}Ga_{0.7}As$, and thus using germanium or tin in place of silicon for the n type doping to de, emphasize the base sidewall orientation will generate dopant diffusion problems.

VFET and Diode Integration

FIGS. 3b and 3d illustrate the use of VFETs in voltage regulators and DC-DC converters as paralleling the freewheeling diode. Further preferred embodiments of the previously described VFETs merge the VFET with a diode in a single integrated circuit, and this combined VFET plus diode can be used in the circuits of FIGS. 3b and 3d or other applications. Indeed, in FIG. 3b the inductor and capacitor and MOSFET are all discrete devices, so integrating diode 346 and VFET 100 lowers the parts count and simplifies assembly. And the parallel diode will be a snubber for the VFET and protect it from overvoltages.

Figure 14:
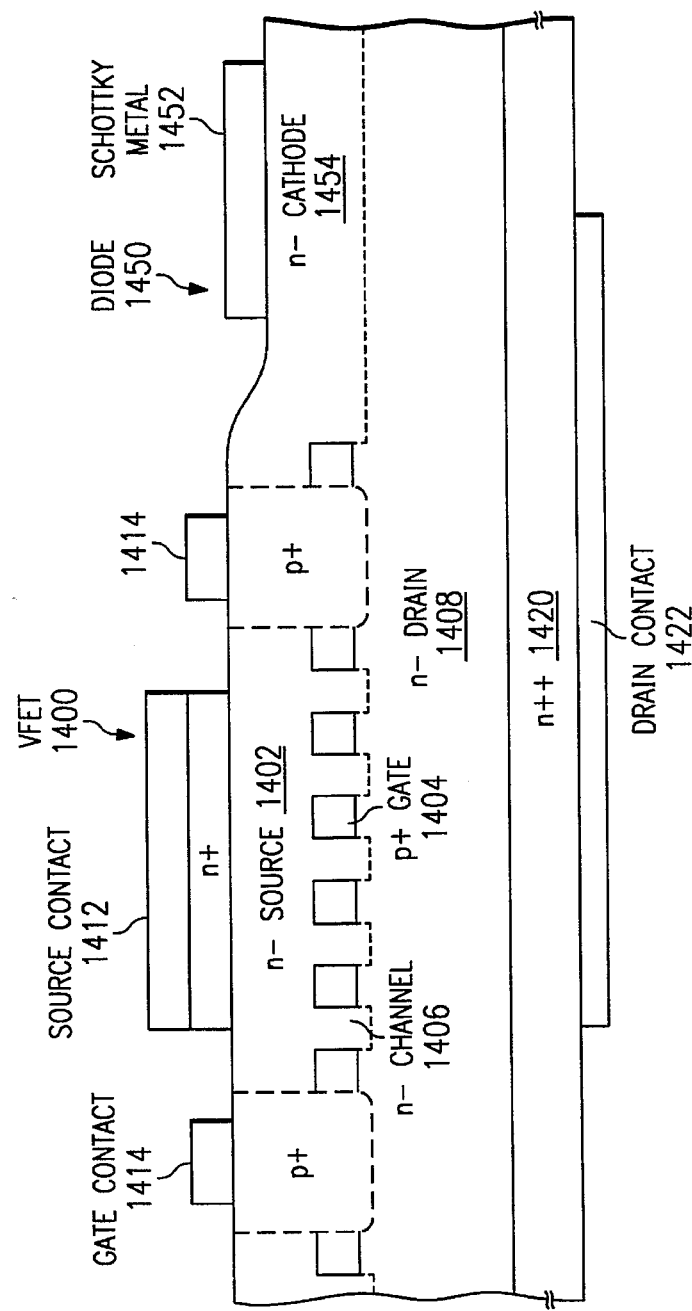
FIGS. 14–16 show preferred embodiments of diodes integrated with vertical field effect transistors.

FIG. 14 heuristically illustrates in cross sectional elevation view a preferred embodiment integrated VFET 1400 and Schottky diode 1450 as including a common n– GaAs layer on an n++ GaAs substrate 1420 which provides electrical connection of VFET drain 1408 to Schottky diode cathode 1454. VFET source contact 1412 can be tied to Schottky metal 1452 with either a metal interconnection on the integrated circuit or each could have bond wires to a common package pad.

VFET 1400 has the same structure as VFET 100 of FIG. 1b, and Schottky diode 1450 is just Ti/Pt/Au on n– GaAs. The n– GaAs doping level and thickness determine breakdown characteristics, and the metal type (titanium for diode 1450) determines the Schottky barrier height. If VFET 1400 is a high breakdown device with a thick n– GaAs drain (layer 1408 is also called the drift region), then Schottky diode 1450 will also be a high breakdown device. The breakdown voltages of the two devices will scale together with the Schottky diode breakdown voltage a little higher because the Schottky diode is a metal plate (typically of area comparable to one-half of the total area of the VFET due to the possibility of large forward current) rather than a gate structure as with the VFET. Of course, the area of the VFET depends upon the desired on resistance $R_{ON}$ and current handling. Also, the Schottky diode has n– cathode 1454 of thickness equal to the sum of the thickness of drain layer 1408 plus the thickness of n– source layer 1402. Theoretically for a parallel plate abrupt diode, the breakdown voltage varies as the $-\frac{3}{4}$ power of the doping level and the $\frac{6}{7}$ power of the drain (drift region) thickness.

Fabrication of Schottky diode 1450 may be incorporated into the process illustrated in FIGS. 4a–l simply by etching away the p++ GaAs layer in the area for Schottky diode 1450 as part of the etch defining the channel regions for VFET 1400. Then after the n– GaAs channel/source epitaxial layer overgrowth, which forms the upper portion of cathode 1454 of Schottky diode 1450, a separate added step for the Schottky metal deposition, such as by liftoff, will complete the VFET plus Schottky diode structure.

Figures 15, 16:
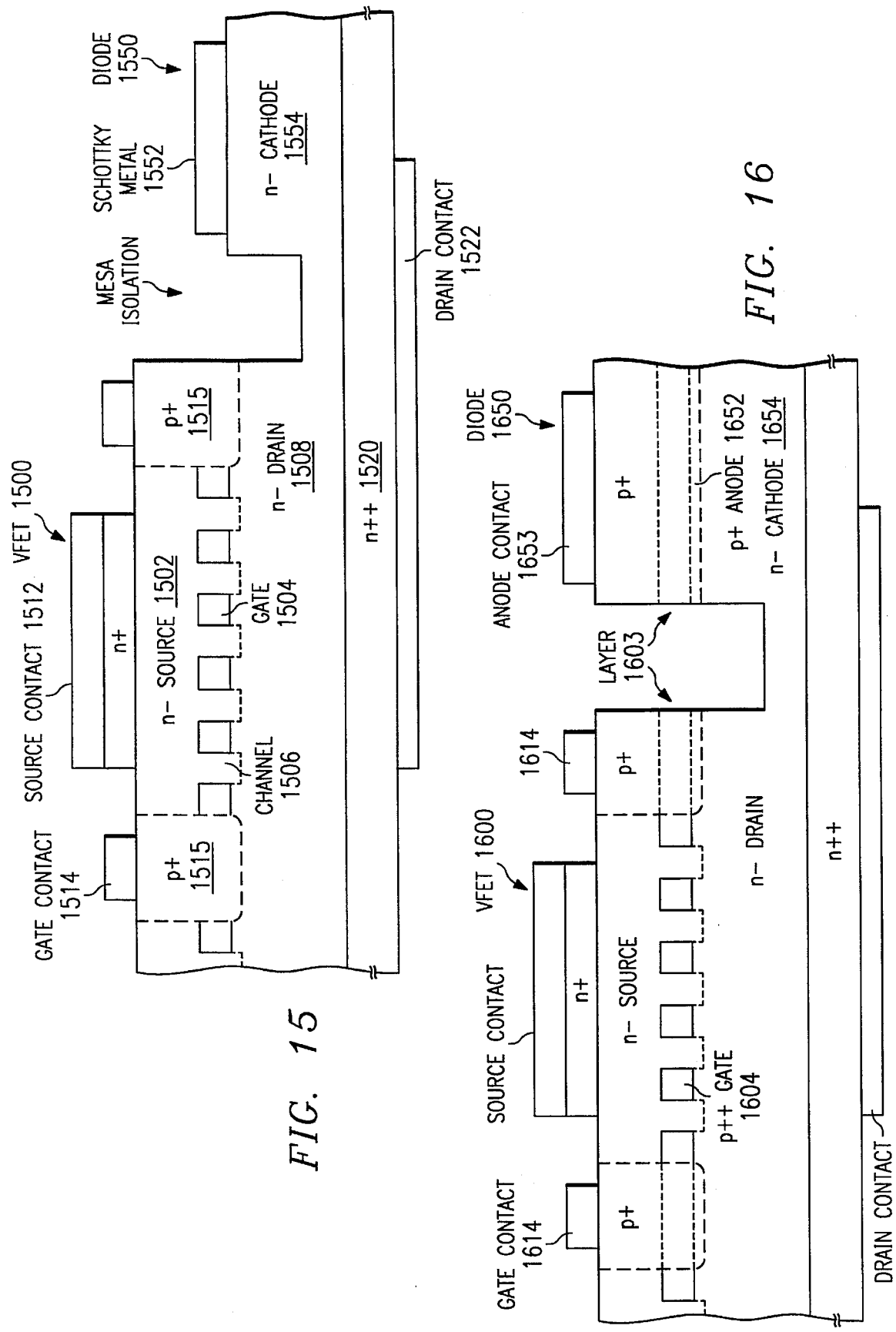

FIG. 15 illustrates a mesa isolation version of the integrated GaAs VFET 1500 and Schottky diode 1550 on substrate 1520 as including VFET n– source 1502, channels 1506, p+ gate fingers 1504, n– drain 1508, p+ doped via 1515 connecting gate fingers 1504 to gate contact 1514, source contact 1512, drain and cathode contact 1522, Schottky metal 1552, and cathode 1554. The VFET and diode may be isolated by etching away a portion of the n– layer forming drain 1508 and cathode 1554 to yield mesas for the VFET and diode. The separation between the mesa for the VFET and the mesa for the Schottky diode may be on the order of 1–5 μm.

Schottky diode 1550 of FIG. 15 also illustrates a cathode structure differing from that of diode 1450 of FIG. 14 in that the n– overgrowth layer forming source 1502 of the VFET does not extend to form part of cathode 1554. Thus in the case of a more highly doped source such as with VFET 1000 of FIG. 10, this higher doped overgrowth epilayer will not extend to the diode cathode and possibly lower the breakdown of the Schottky diode. This cathode structure may be obtained by etching away the overgrowth epilayer at the diode location or by depositing silicon nitride at the location of the diode prior to the overgrowth epilayer, the epilayer will not grow on nitride and after the overgrowth the nitride will be stripped.

FIG. 16 shows an integrated circuit containing VFET 1600 and p-n diode 1650. VFET 1600 has the structure of previously described VFETs and may be fabricated in a similar manner. Diode 1650 is formed by simply leaving the p++ layer 1603 which yielded gate fingers 1604 for the VFET in place for the diode and extending to the diode the p+ implant for the doped vias connecting gate fingers 1604 to gate contacts 1614; this will form anode 1652. Anode contact 1653 may be formed at the same time as gate contacts 1614. Thus no extra processing steps are needed for diode 1650.

However, a p-n diode such as diode 1650 will have a turn-on voltage of roughly 1.2 volts while a Schottky diode such as diode 1450 or 1550 will have a turn-on voltage of roughly 0.7 volt. Usually a Schottky diode would be preferred due to the lower power loss when the diode is used for rectification, as a free wheeling diode, or as a snubber.

Similarly, an HBT as in FIG. 13 may be integrated with a diode where the diode's cathode and the HBT collector are in a common layer. The base and emitter overgrowth layers are etched away analogous to the fabrication of the FIG. 15 structure.

Germanium Substrate

Figure 17:
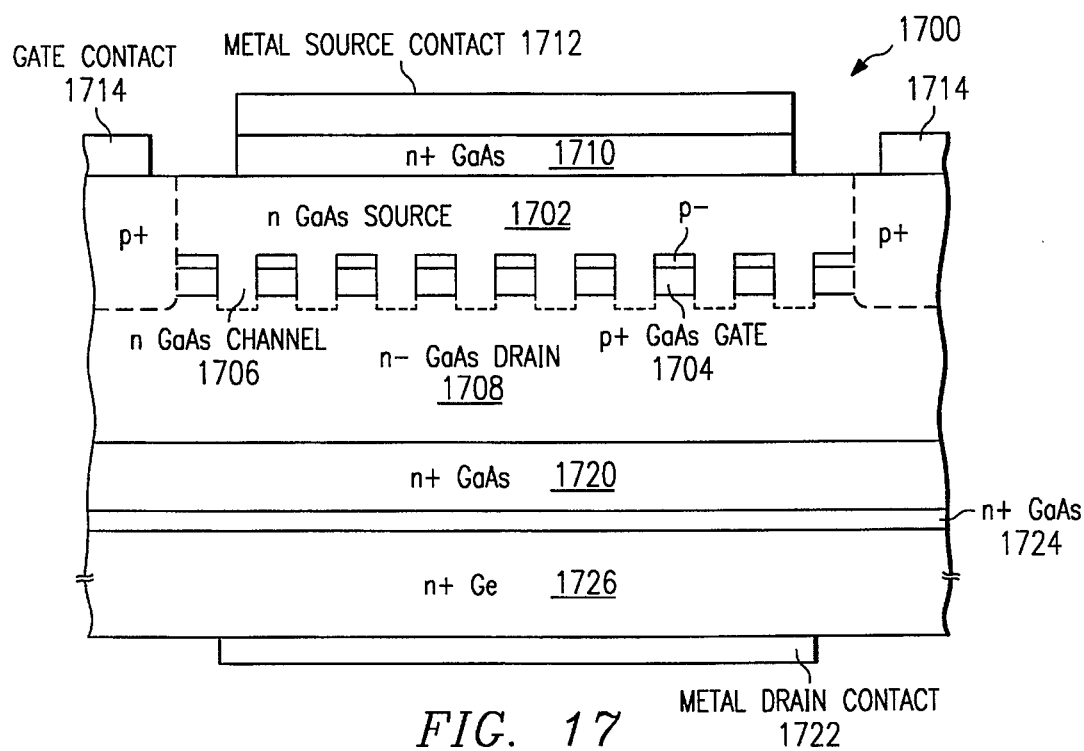
FIG. 17 illustrates in cross sectional view a seventh preferred embodiment.

FIG. 17 shows in cross sectional elevation view a seventh preferred embodiment VFET, generally denoted by the reference numeral 1700, made of epitaxial GaAs on a germanium (Ge) substrate 1726 and including n doped GaAs source 1702, p–/p++ doped layered GaAs gate 1704 in the form of parallel fingers with n doped channel regions 1706 between successive gate fingers, n doped GaAs drain 1708 including a drift region, n+ doped GaAs source contact 1710, and n+ doped GaAs drain contact 1720; n+ GaAs buffer layer 1724 provides transition from n+ drain contact 1720 to n+ Ge substrate 1726 and drain metal contact 1722. VFET 1700 is analogous to the previously described VFETs except for the Ge substrate. VFET 1700 has the following dimensions: gate finger and channel region length 0.5 µm with the top 0.1 µm of the gate fingers lightly doped p type (on the order of $10^{14}/cm^3$ which can be achieved by control of the Ga to As source ratio during the eitaxial growth) for breakdown increase. Gate finger breadth 0.4–0.5 µm, channel region opening 0.5 µm, source length 0.7 µm, and drain length 1.5 µm. The n+ drain contact layer 1720 is 0.5 µm thick, n+ GaAs transition layer 1724 is 0.1 µm thick, and n+ Ge substrate 1726 is 250 µm thick.

The n– doping level of source 1702 is about $7\times10^{16}/cm^3$ and the n– doping level of channel regions 1706 is about half of this: $3\times10^{16}/cm^3$, the overgrowth of n– GaAs to form the channel regions and the bottom of the source apparently incorporates the in situ silicon dopant less electrically effectively in the channel regions to yield the lower n type doping. The doping level of drain 1708 is about $1\times10^{16}/cm^3$, and n+ doping level of drain contact 1720 and GaAs transition layer 1724 is about $2\times10^{16}/cm^3$. Ge substrate 1726 has an n+ doping level of about $1\times10^{20}$ antimony atoms/$cm^3$. The high doping level and relative thinness of Ge substrate 1726 simplifies VFET processing; of course, the initial growth of epitaxial GaAs on a Ge substrate is more involved than epitaxial GaAs on a GaAs substrate. The in situ carbon doping to make up p+ gate 1704 is about $1\times10^{20}/cm^3$.

Figure 18:
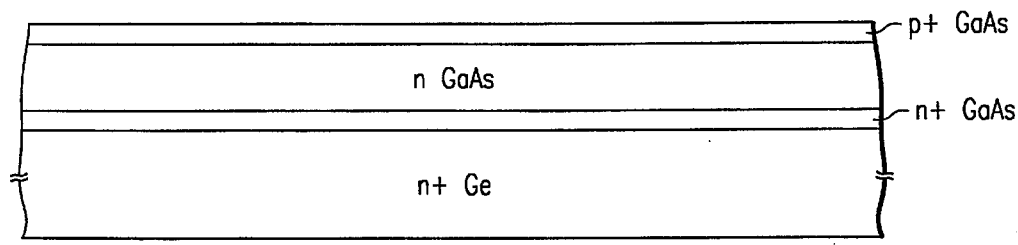
FIG. 18 shows a composite starting wafer.

Fabrication of VFET 1700 follows the same steps as the fabrication of the previously described VFETs as illustrated in FIGS. 4a–m. However, the starting wafer is an n+ Ge substrate with GaAs epitaxial layers as illustrated in FIG. 18 rather than the GaAs wafer of FIG. 4a. The n+ GaAs layer typically includes a thin n+ GaAs transition layer, for example grown by MOCVD at a low temperature such as 650° C. to overcome the lattice mismatch between GaAs and Ge, plus an n+ GaAs layer grown at higher temperatures. As previously described, the orientation of the Ge substrate is preferably (100) with no tilt ±0.5° to aid the GaAs overgrowth after the gate etch.

The extra strength of Ge compared to GaAs permits use of larger and thinner wafers. Larger wafers lowers costs and thinner wafers avoids final wafer thinning processing steps.

VFET 1700 could be used in synchronous rectifiers (FIG. 3d item 370) with 3.3 or 1.5 volts output. For higher voltage operation, drain 1708 could be increased in length.

Heterojunction Bipolar Transistor on Germanium Substrate

Figure 19:
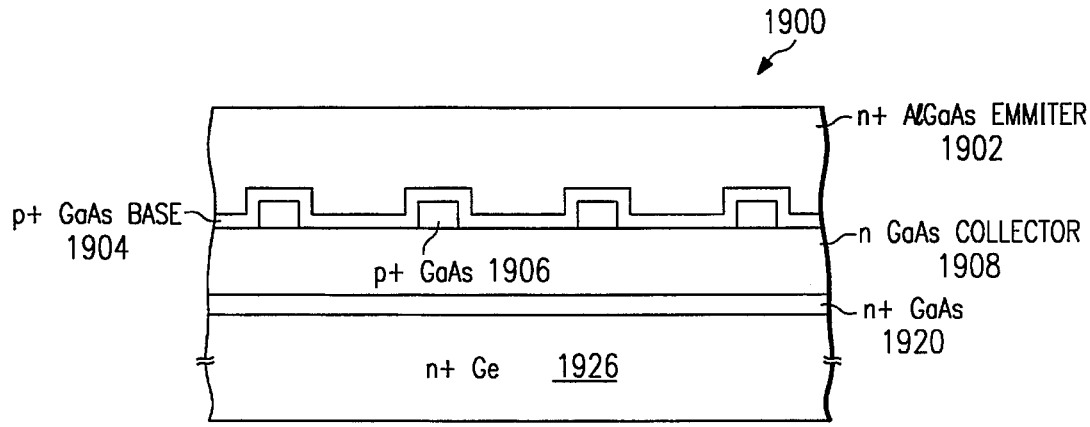
FIG. 19 illustrates a preferred embodiment heterojunction bipolar transistor.

The epitaxial GaAs on Ge substrate structure may also be used for a heterojunction bipolar transistor (HBT) analogous to the HBT of FIG. 13. Indeed, FIG. 19 shows a cross sectional elevation view of HBT 1900 with n+ AlGaAs wide bandgap emitter 1902, p+ GaAs base 1904 in the form of an overgrowth layer on p+ GaAs fingers 1906, n GaAs collector 1908 on n+ GaAs layer 1920 and n+ Ge substrate 1926. Base 1904 may have a very small width because it is just the thickness of an overgrowth layer, and the p+ fingers 1906 provide a low extrinsic base resistance.

Modifications and Advantages

The preferred embodiments may be varied in many ways while retaining one or more of the features of overgrowth on a GaAs epitaxial structure on a germanium substrate.

For example, the dimensions of the various components could be varied, the geometry of the gates in the VFETs could be varied, other III–V materials such as GaP, InP, $Ga_xIn_{1-x}P$, $In_xGa_{1-x}As$, AlAs, $Al_xGa_{1-x}As$, and so forth also have the zinc blende crystal structure and overgrowth properites as GaAs. Indeed, generally ends of elongated grooves (as for the channels) are expanded perpendicularly at their ends to have a flat end; that is, an "I" turns into a "T". Thus a single isolated groove will still be expanded but will only locally disconnect its end sidewall from its lengthwise sidewalls analogous to the expanded slot of FIG. 4m. The GaAs may be an island of material within a recess in a silicon wafer. The p+ doping by Be to make connection to the disconnected buried gates may be replaced by Zn doping, either implantation or diffusion; in this case gate contacts may be alloys such as TiPtAu. Other Group II elements could also be used as p type dopants, such as Mg or more than one Group II element. (Be, Mg, . . . are Group IIA and Zn is Group IIB.) Also, diamond and silicon carbide are possible materials for VFETs.

What is claimed is:

1. A method for fabrication of a vertical field effect transistor, comprising the steps of:

(a) providing a substrate of a first semiconductor material and first conductivity type with a first epitaxial layer of a second semiconductor material and said first conductivity type on said substrate, said second semiconductor material being different from said first semiconductor material;

(b) forming a plurality of gate fingers of said second semiconductor material and of a second conductivity type on said first epitaxial layer; and (c) forming a second epitaxial layer on said gate fingers and said first epitaxial layer, said second epitaxial layer of said second semiconductor material and said first conductivity type and forming channels between adjacent ones of said gate fingers and a planar source over said gate fingers and said channels.

2. The method of claim 1, wherein:

(a) said first semiconductor material is germanium; and (b) said second semiconductor material is gallium arsenide.

3. The method of claim 1, wherein:

(a) said first epitaxial layer includes a first sublayer on said substrate and a second sublayer abutting said gate fingers, wherein said first sublayer is more heavily doped than said second sublayer.

4. The method of claim 3, wherein:

(a) said source is more heavily doped than said first sublayer.

5. The method of claim 1, wherein:

(a) said substrate has a crystal orientation of (100) ±0.5°.

6. The method of claim 1, wherein:

(a) said step (b) of claim 1 includes removing portions of a third epitaxial layer on said first epitaxial layer.

\* \* \* \* \*